(12) United States Patent
Constien et al.

(10) Patent No.: US 8,258,748 B2
(45) Date of Patent: Sep. 4, 2012

(54) METHODS AND APPARATUS FOR MODELING, MONITORING, SIMULATING AND CONTROLLING POWER CONSUMPTION IN BATTERY-OPERATED DEVICES

(75) Inventors: Scott Douglas Constien, Plano, TX (US); Charles Chapman Moore, Plano, TX (US); Daniel Martin Donahue, Sachse, TX (US); Thomas Howard Daugherty, Jr., Lantana, TX (US)

(73) Assignee: Enfora, Inc., Richardson, TX (US)

( * ) Notice: Subject to any disclaimer, the term of this patent is extended or adjusted under 35 U.S.C. 154(b) by 393 days.

(21) Appl. No.: 12/402,367

(22) Filed: Mar. 11, 2009

(65) Prior Publication Data

US 2010/0235007 A1    Sep. 16, 2010

(51) Int. Cl.
*H02J 7/00* (2006.01)
*G06F 1/00* (2006.01)
(52) U.S. Cl. .................. 320/127; 320/132; 713/300
(58) Field of Classification Search .................. 320/127, 320/132
See application file for complete search history.

(56) References Cited

U.S. PATENT DOCUMENTS

| | | | |
|---|---|---|---|
| 5,635,813 A | 6/1997 | Shiga et al. | |
| 5,860,106 A | 1/1999 | Domen et al. | |
| 5,925,129 A * | 7/1999 | Combs et al. | ................. 713/300 |
| 6,038,515 A | 3/2000 | Kikuchi et al. | |
| 6,291,966 B1 | 9/2001 | Wendelrup et al. | |
| 6,433,512 B1 | 8/2002 | Birkler et al. | |
| 6,641,232 B1 | 11/2003 | Alaze | |
| 6,661,339 B2 | 12/2003 | Muirhead | |
| 6,915,221 B2 | 7/2005 | Pehrsson et al. | |
| 6,943,678 B2 | 9/2005 | Muirhead | |
| 7,082,373 B2 | 7/2006 | Holle | |
| 7,209,771 B2 | 4/2007 | Twitchell, Jr. | |
| 7,260,728 B2 | 8/2007 | Chang et al. | |
| 7,266,389 B2 | 9/2007 | Karaoguz et al. | |
| 7,342,496 B2 | 3/2008 | Muirhead | |
| 7,388,492 B2 | 6/2008 | Watanabe | |
| 7,735,430 B2 | 6/2010 | Muirhead | |

(Continued)

OTHER PUBLICATIONS

International Search Report dated Jun. 28, 2010 in connection with international Patent Application No. PCT/US2010/027028.

(Continued)

*Primary Examiner* — M'Baye Diao
(74) *Attorney, Agent, or Firm* — Robert D. McCutcheon

(57) ABSTRACT

A computer-based processing system (e.g., host server) is operable for receiving historical device operation information (power consumption data) collected during operation of the remote battery-operated device in accordance with a first set of operating parameters. The first set of operating parameters enable operation of the battery-operated device in a first operating mode. The processing system calculates an observed battery life for the device based on the received historical power consumption data and a power capacity value representing a power capacity of the battery resident in the device. This observed battery life may be output to a user and used to determine whether the device will meet a predetermined operational life. If not, parameters for the device can be modified and a new projected battery life calculated (simulation), with the new modified parameters controlling power consumption in the device.

19 Claims, 9 Drawing Sheets

U.S. PATENT DOCUMENTS

| | | |
|---|---|---|
| 7,789,024 B2 | 9/2010 | Muirhead |
| 7,804,400 B2 | 9/2010 | Muirhead |
| 7,948,371 B2 | 5/2011 | Muirhead |
| 2008/0121339 A1 | 5/2008 | Muirhead |
| 2008/0299938 A1 | 12/2008 | Meshenberg |
| 2009/0237222 A1 | 9/2009 | Muirhead |
| 2011/0073250 A1 | 3/2011 | Muirhead |

OTHER PUBLICATIONS

Written Opinion of the International Searching Authority dated Jun. 28, 2010 in connection with International Patent Application No. PCT/US2010/027028.

Letter dated Mar. 12, 2012 from Scott Muirhead of Nextreme, LLC to Robert D. McCutcheon of Munck Wilson Mandela, LLP, 5 pages.

* cited by examiner

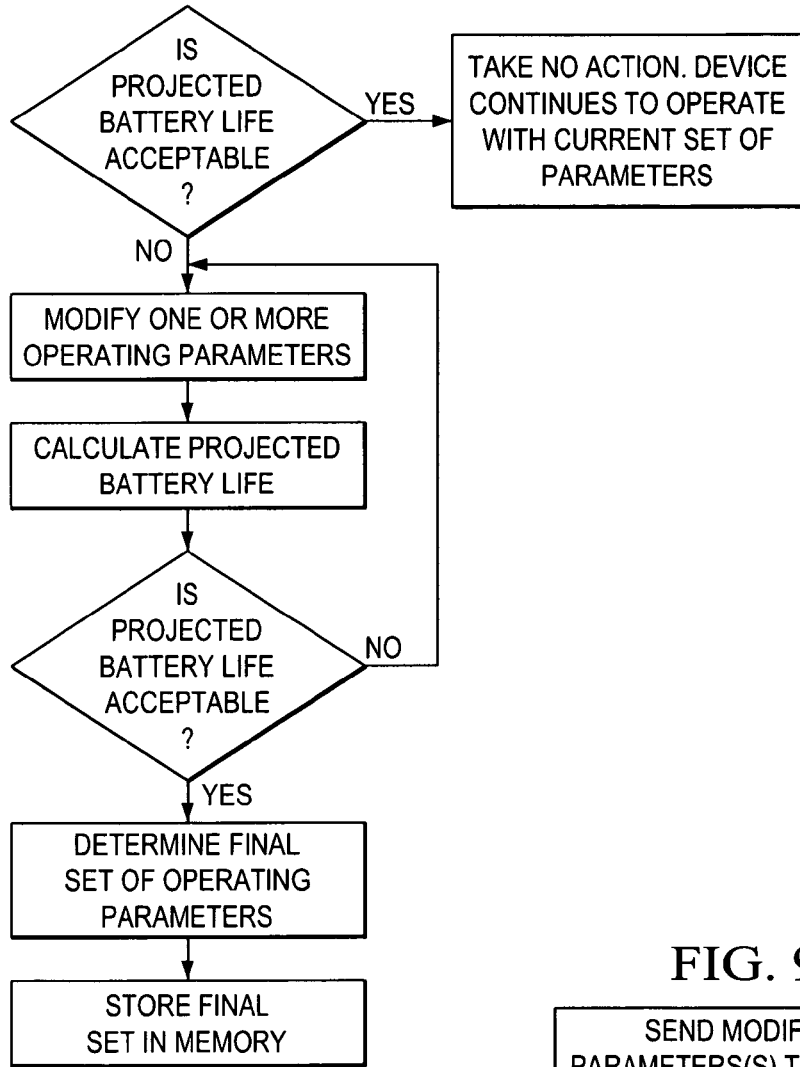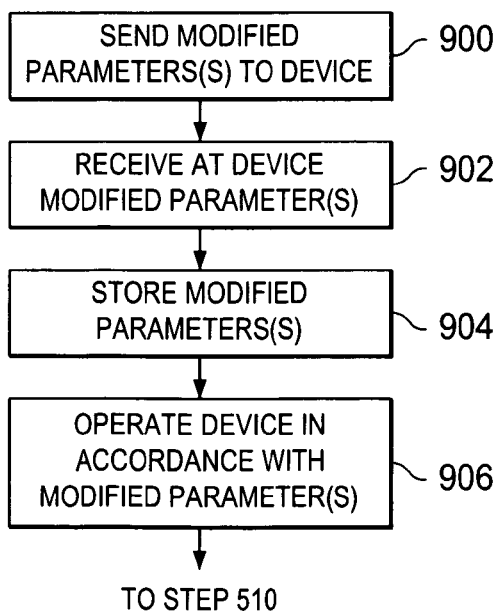

METHODS AND APPARATUS FOR MODELING, MONITORING, SIMULATING AND CONTROLLING POWER CONSUMPTION IN BATTERY-OPERATED DEVICES

CROSS-REFERENCE TO RELATED APPLICATIONS

This patent application is related to:
U.S. patent application Ser. No. 12/402,392 entitled "METHODS AND APPARATUS FOR MODELING, MONITORING, ESTIMATING AND CONTROLLING POWER CONSUMPTION IN BATTERY-OPERATED DEVICES" filed on Mar. 11, 2009 ; and
U.S. patent application Ser. No. 12/402,379 entitled "METHODS AND APPARATUS FOR MODELING, SIMULATING, ESTIMATING AND CONTROLLING POWER CONSUMPTION IN BATTERY-OPERATED DEVICES" filed on Mar. 11, 2009 ;
which are both hereby incorporated by reference.

TECHNICAL FIELD

The present invention relates generally to battery-operated remote communication devices, and more particularly, to methods and apparatus for modeling and controlling power consumption in battery-operated communication devices.

BACKGROUND

Battery-operated communication devices are becoming increasingly complex. Added and more diverse capabilities and functionality result in the need for increased power. Increased power consumption results in shorter battery life. This is even more important in mobile unmanned devices in which batteries are not easily replaced or re-chargeable.

U.S. Pat. No. 7,266,389 relates to power management by allocating power to elements of a device needed for specific applications. U.S. Pat. No. 7,260,728 distributes shares of power to specific tasks as part of a power management policy.

Accordingly, there is a need for methods and apparatus for power management in battery-operated devices to model, monitor and reduce power consumption, thereby increasing battery life in order to extend useful operation of the device.

SUMMARY

In accordance with one embodiment, there is provided a method for determining power consumption and battery life in a battery-operated device having a battery for supplying power to the device. The method includes receiving historical power consumption data collected during operation of the battery-operated device in accordance with a first set of operating parameters, the first set of operating parameters enabling the battery-operated device to operate in a first operating mode; calculating, in a computer-based processing system, an observed battery life for the device based on the received historical power consumption data and a power capacity value representing a power capacity of the battery within the device; and outputting the observed battery life to a user.

In accordance with another embodiment, there is provided a method for modifying operation of a battery-operated device having a battery and controlling power consumption of the device. The method includes receiving historical data via a communications link from a battery-operated device operating at a remote location in accordance with a current set of operating parameters, the historical data relates to a pre-determined operating time period, and the historical data includes a number of occurrences of a first event, a total amount of time spent performing the first events, a number of occurrences of a second event, and a total amount of time spent performing the second events. An observed power consumption value is calculated based on the received historical data and an observed battery life is calculated which identifies an observed amount of time the battery will be able to supply power sufficient to operate the device if the device operates in accordance with the current set of operating parameters. If the observed amount of time is unacceptable, one or more parameters of the first set of parameters is modified to generate a second set of parameters, and data is sent to the battery-operated device enabling subsequent operation of the battery-operated device in accordance with the second set of parameters.

In yet another embodiment, there is provided a host server for calculating power consumption in a battery-operated device and controlling its power consumption. The server includes a communications interface operable for receiving historical power consumption data from the battery-operated device, the historical data collected during operation of the battery-operated device in accordance with a first set of operating parameters; a processor configured to calculate an observed battery life for the device based on the received historical power consumption data and a power capacity value representing a power capacity of the battery within the device; an output device for outputting the observed battery life and one or more parameters of the first set of operating parameters to a user; and an input device for receiving user input to modify one or more parameters within the first set of operating parameters. The processor is further configured to send, via the communications interface, the one or more modified operating parameters to the battery-operated device, the one or more modified operating parameters enabling subsequent operation in accordance therewith.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 8 is a more detailed flow diagram illustrating the simulation process and determination of a final set of operating parameters (re-configuration) as set forth in FIG. 5; and FIG. 9 is a more detailed flow diagram illustrating the process for re-configuring the device 102 (for controlling power consumption) as set forth in FIG. 5.

DETAILED DESCRIPTION

Figure 1:
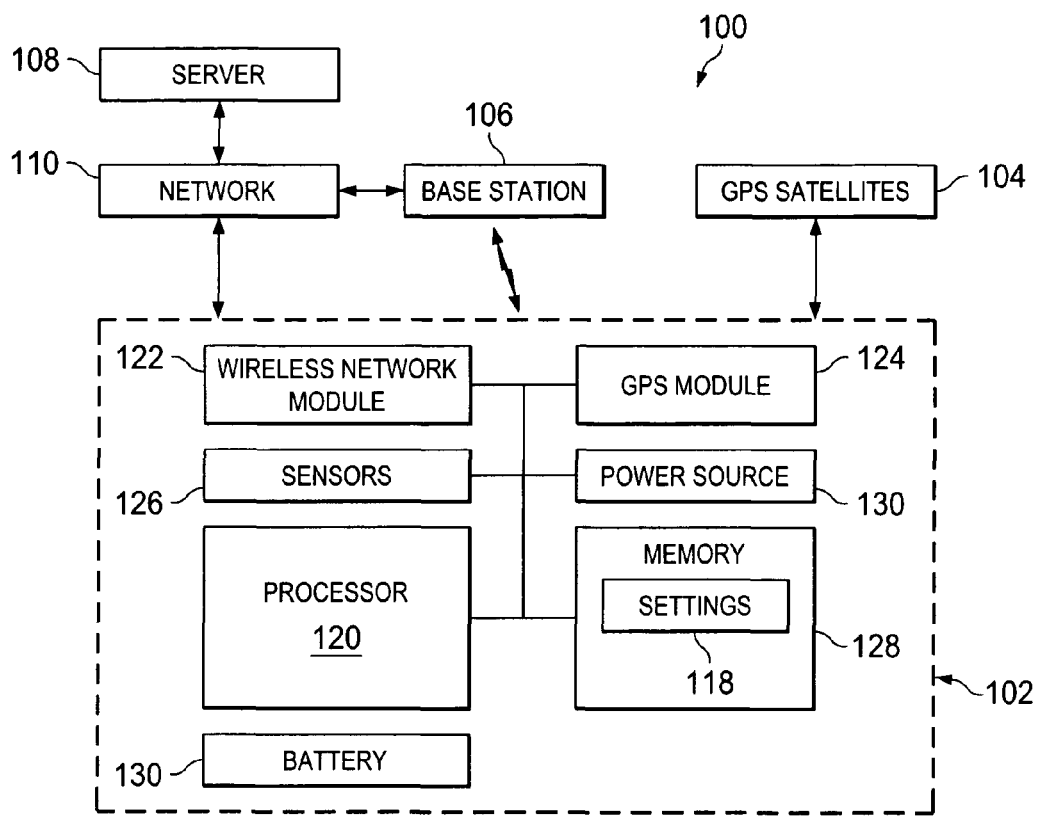
FIG. 1 is a block diagram illustrating a tracking or monitoring system for use with a battery-operated device in accordance with the present disclosure.

FIG. 1 is a block diagram illustrating one system 100 in which the teachings and principles of the present disclosure may be incorporated or utilized within and are applicable for a battery-operated device. One example of such a battery-operated device is a Global Positioning System (GPS) tracking device that has the ability to transmit GPS data over a wireless network. GPS data is used to determine the exact location of the battery-operated device (which is mounted or attached to equipment being monitored). In one specific example, the GPS tracking device includes a location/position module (for determining location/position information such as GPS data) and a wireless communications modem or radio (e.g., a Global System for Mobile/General Packet Radio Service (GSM/GPRS) module) to transmit the location information (e.g., GPS data) to a remote communications device (e.g., host server). Through the combination of such a GPS module and the GSM/GPRS module, the GPS tracking device can both obtain GPS data as well as transmit the GPS data wirelessly to the remote server. Various GPS tracking devices may incorporate or include some of the methods and apparatus described herein, and a typical device suitable for modification and/or use in the system are available from Enfora, Inc. (Richardson, Tex.) under different part/model numbers, including GSM 2228, GSM 2218 and GSM 2238.

The system 100 is shown as a GPS tracking system that includes a GPS tracking device 102 and one or more GPS satellites 104. The system 100 also includes various remote communications devices, such as a base station 106 and a host server (or computer processing system) 108, that communicate with the GPS tracking device 102 through a telecommunications network 110. Though the embodiments described herein illustrate an example GPS tracking device 102, the methods and apparatus described herein may be applied to, or utilized with, other battery-operated devices. For tracking or monitoring equipment (or other environmental attributes in the location of the equipment), the device is adapted for mounting to or inclusion in such equipment (e.g., a mobile or stationary structure or device), sometimes referred to as an asset (i.e., asset tracking and monitoring).

The GPS tracking device 102 includes a processor (e.g., controller) 120, a wireless network module 122 (such as a GSM/GPRS/EDGE modem), a GPS module 124, one or more sensors 126, memory 128, and a power source 130, such as a battery. Various different types (e.g., lithium-ion, nickel-cadmium, etc.), physical sizes and/or capacities (power ratings) of batteries may be used, and the battery 130 may be chosen based on the desired application. Once chosen, the power capacity becomes known. In one embodiment, the battery 130 is non-rechargeable and is permanent (or may possibly be replaceable), and in another embodiment the battery 130 is rechargeable, and in either may be a primary cell battery or a secondary cell battery.

The memory 128 may include and store various data and settings 118, including programmable operating parameters. The device 102 may include a real-time clock and other components for providing additional functionality. The one or more sensors 126 may include sensors that measure/sense motion, temperature, velocity, presence or absence of a particular element, or include other functionality for performing any other task.

The GPS module 124 (including a GPS receiver, not shown) receives satellite communications from one or more GPS satellites 104 and calculates GPS position/location information. One example of a suitable GPS module (which includes a GSM module) is available from Enfora, Inc. under part number LPP0108.

In a different embodiment, other location determining methods may be used, such as position triangulation using one or more base stations or other reference points. The wireless network (or communications) module or modem 122 (including a transceiver, not shown) provides wireless communication functionality between the GPS tracking device 102 and the base station 106 and/or host server 108, including transmitting position/location information, such as GPS data, to a remote device (e.g., host server or computer processing system 108). Wireless network module 122 may use any technology including, but not limited to, code division multiple access (CDMA), global system for mobile (GSM) communications, worldwide interoperability for microwave access (WiMAX), or any other wireless standard. One example of a suitable communications module is available from Enfora, Inc. under part number GSM0308. In other embodiments, the module 122 may be a network interface for wired communications.

As will be described in more detail below, power management and consumption information, as well as device operating parameters, are also communicated between the host server 108 and the GPS tracking device 102.

The network 110 may include one or more local area networks ("LAN"), metropolitan area networks ("MAN"), wide area networks ("WAN"), all or portions of a global network, or any other communication system or systems at one or more locations, or combination of these, including the public switched telephone network (PSTN), Internet, packet networks and the like.

The system 100 shown in FIG. 1 is for illustration purposes only. Other embodiments of the system 100 may be used without departing from the scope of this disclosure. Other components, devices or networks may be included in the system 100, and FIG. 1 only illustrates but one exemplary configuration to assist in describing the system and operation of apparatus and methods described herein to those skilled in the art. The system represented in FIG. 1 may be described using different nomenclature or system terminology, and the use of any given nomenclature to describe a device within the system 100 is not intended to limit the scope of this disclosure.

In general terms, and in one embodiment, the present disclosure provides power consumption modeling and control for battery-operated devices. Power consumption of a device, using the GPS tracking device 102 as an illustrative example, can be modeled using a state diagram, where each state (representing an operational condition, such as a defined task, process, event or function) consumes a predetermined or predictable amount of power. Entry and exit conditions represent transitions between states that occur upon an event, and likewise consume power. In the power consumption model, each state is represented as requiring predetermined power for one or more specific periods of time. The period of time is based upon both configured parameters (e.g., GPS Acquisition timeouts) and environmental conditions (e.g., access to GPS satellites), and the instantaneous power requirements are based upon both measured values (e.g., power consumption in Idle State) and site specific values (e.g., distance to cellular tower). Entry and exit conditions for each state are utilized to simulate an operational environment and battery life expectancy can be calculated (projected) based on various programmable (and non-programmable) operating parameters. While the amount of power consumed in each state and during a state transition may not be determined exactly, knowledge of the components and operations performed during each state or transition allow a theoretical (or predictable or predetermined) power consumption value to be generated. Results from direct measurement of power consumption during testing/design may also be used to generate the theoretical power consumption value(s).

In another embodiment, operational monitoring (historical data) of states and state transitions within the GPS tracking device 102 allows for an "observed" real-time calculation of the power consumed (i.e., battery usage) by the device. Since each state or state transition (or task/event) has associated therewith a theoretical power consumption value representing the amount of power consumed by that event (or time spent executing each event), an event total power value can be calculated based on the number of times each event occurs in the time period of interest, and/or may also be calculated based on the total time duration spent in executing each event. Overall total power consumption can be determined. The raw operational data (or a calculated value of the amount of power consumed based on the raw data) is transmitted to a remote device (e.g., server 108). In another embodiment (not shown), a coulomb counter or other power measuring device or method may be used to determine power consumption for specific components or modules within the GPS tracking device 102 or for the overall device, which is transmitted to the host server 108.

In another embodiment, the historical operational data received from the GPS tracking device 102 at the server 108 is utilized to determine the amount of power consumed from the device's battery, and hence, the remaining power capacity in the battery life (i.e., the battery's original power capacity minus the power consumed). From this, the battery life expectancy can be calculated based on the currently programmed operating parameters—e.g., how long will the battery last based on the device's current operating parameters. The number and/or time within each state or state transition can also provide additional information to analyze or assess the device's performance. Based on the received information, the server 108 can (automatically or with user input) program or modify the device's operating parameters that will affect or change its future power consumption (or rate of consumption).

This capability enhances the underlying power consumption model described herein and allows for the operational situation observed at the device location to be utilized to recalculate and modify configurable operational parameters of the device to affect subsequent device operation. Device behavior and operation can be changed to modify the battery life of the device, both to meet new operational requirements and to reflect unexpected operational environments.

In another embodiment, the server 108 includes a graphical user interface (GUI) or graphical representation of battery use under user-defined usage scenarios. A user can dynamically alter an underlying model of power consumption by varying operational parameters and/or expected environmental conditions for device operation. The combination of GUI and server 108 enhances the underlying power consumption model described herein and allows a user to explore a large number of device configuration options, and the effect of these modifications on battery usage and life (power consumption) prior to device placement in the field. The server 108 includes functionality for automatically configuring the device to parameters as configured (through the user interface), for automatically modifying the device power consumption model based upon actual location or site behavior, modification of operational parameters, or modifications to the state machine (e.g., disabling GPS reporting in the absence of GPS acquisition), and for allowing a user to reconfigure the device using observed environmental conditions and battery capacity consumed to create a new set of operating parameters to customize and change the device's remaining battery life. Though other user interfaces may be utilized with the server 108, a GUI provides simplified input and easily viewed and understood graphical representations of the known and calculated data.

In yet another embodiment, the battery-operated device may function as a relay device or gateway for other remote battery-powered devices. This relay device or gateway receives power consumption or battery capacity information from the remote battery-operated devices via a wireline or wireless communication path and transmits the information to another communications device (e.g., server 108). In another embodiment, the relay device or gateway may include additional functionality to process the information and change or modify operating parameters of the remote device, or otherwise control its operation.

Figure 2:
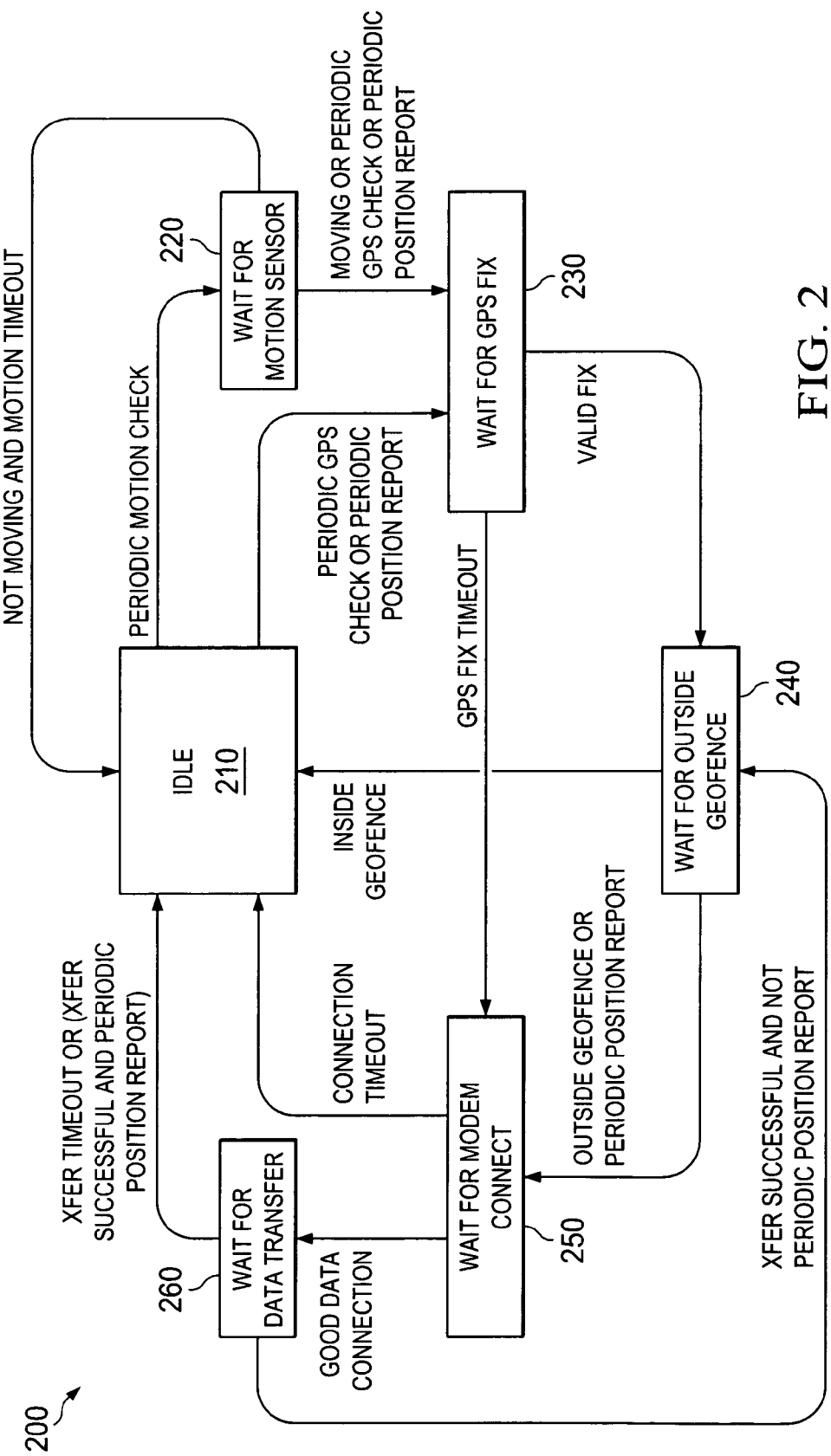
FIG. 2 is a flowchart illustrating an example state diagram in accordance with the present disclosure.

Now referring to FIG. 2, there is shown a state diagram 200 illustrating various operating states and transitions between states for the GPS tracking device 102. This diagram models operation of the device 102 and illustrates one example of how state diagrams may be used to model device operation with a focus on power consumption. It is understood that the specific configuration (number, function) of the states (and transitions representing entry and exit conditions) in the state diagram will depend on the desired operation and functionality of the battery-operated device, such as the GPS tracking device 102. Different types of battery-operated devices 102 (and different applications) will exhibit different states and state diagrams. Each state represents a defined task, process, function, operational condition or event (each can be referred to as an "event") consumes a predetermined or predictable amount of power. Entry and exit conditions represent transitions between states and are associated with a defined task, process, event or function of the relevant state(s), and may consume power. Parameters and variables related to the entry/exit conditions are programmable (and the state machine may also be modifiable, such as when one state is bypassed entirely). Depending on the values, an expected battery life (depending on the battery's specifications) can be calculated.

The state diagram 200 includes a number of different states, including an IDLE state 210, a MOTION SENSOR state 220, a GPS FIX state 230, a WAIT FOR OUTSIDE GEOFENCE state 240, a MODEM CONNECT state 250, and a DATA TRANSFER state 260. Each state represents an operational condition of the GPS tracking device 102 in which one or more predetermined function(s) or task(s) are performed. As will be appreciated, the number of states in the state diagram 200 may be more or less—depending on the desired functionality of the device 102.

A transition from one state to another state occurs in response to a detected event (or events), activity, or condition. Examples include timeouts, motion, position, periodic checks, or a successful (or unsuccessful) process, function or task, and the like. Entry and exit scenarios are definable based on time events, detected activity, predicted performance or completion of specific tasks or operations.

The IDLE state 210 is a state in which all or substantially all of the components in the device 102 are powered down or idle (e.g., idle or sleep state/mode). While in this state, power consumption may be low, and the device 102 consumes a predetermined or predicted amount of power per unit time (IDLE state power consumption value).

The MOTION SENSOR state 220 is a state in which the device 102 performs a low power motion monitoring process, including activating/polling the motion sensor 126. While in this state, power consumption may be relatively low, and the device 102 consumes a predetermined or predicted amount of power per unit time (MOTION SENSOR state power consumption value).

The GPS FIX state 230 is a state in which the device 102 performs a location determining process, including activating and operating the GPS module 124 to acquire signals for determining the device's location using GPS. In this state, power consumption may be appreciable, and the device 102 consumes a predetermined or predicted amount of power (GPS FIX state power consumption value).

The WAIT FOR OUTSIDE GEOFENCE state 240 is state in which the device 102 waits for a period of time until a certain event occurs based on an elapsed time (timeout) and/or device position. In this state, GPS functionality remains active and geographic coordinates are calculated. Power consumption may be appreciable, and the device 102 consumes a predetermined or predicted amount of power (WAIT FOR OUTSIDE GEOFENCE state power consumption value). It will be understood that certain applications may not require a geofence determination process and may simply track the location of the device 102 periodically or as polled and the calculation of actual location information may be done in this state or in the GPS FIX state.

The MODEM CONNECT state 250 is a state in which the device 102 performs a communications connection function to connect to a remote device, including activating and operating the GSM module 122 to initiate and setup a data communications connection or path between the device 102 and a remote device (e.g., a wireless base station or server). In this state, power consumption may be appreciable, and the device 102 consumes a predetermined or predicted amount of power (MODEM CONNECT state power consumption value).

The DATA TRANSFER state 250 is a state in which the device 102 transfers data (or receives data) via the communications connection or path established in the MODEM CONNECT state, including activating and operating the GSM module 122 to transfer or receive data between device 102 and a remote device (e.g., wireless base station 1106 or server 108). In this state, power consumption may be appreciable, and the device 102 consumes a predetermined or predicted amount of power (DATA TRANSFER state power consumption value).

The following description illustrates one example of various transitions between states in the state diagram 200 for a GPS tracking device 102 that can be used to calculate or track power consumption in the battery-operated GPS tracking device 102. As previously noted, the configuration (e.g., number, type) of states, the transitioning (e.g., number, type) between states, and the task(s) or process(es) (e.g., number, type) performed in a particular state may be different and varied, depending on the desired application. As described further below, the calculations of power consumption and calculated remaining battery life depend on device settings and/or network-related settings that are fixed and/or programmable and environmental factors (e.g., GPS satellite acquisition time, wireless registration, or wireless signal strength). The accuracy of these calculations may depend on the granularity of the state diagram and knowledge of the operational environment (and additional delineation of the number of tasks or processes within each state). In other words, by partitioning the global function of the device into a larger number of distinct states and/or more accurately modeling the operational environment (and processes or tasks within each state), the power consumption and battery life calculations will likely be more accurate. However, the specific formation and configuration of the state diagram model and power consumption values utilized or chosen for a desired application/device is within the discretion of the designer and may result in a tradeoff between accuracy and complexity.

Referring back to FIG. 2, the device 102 transitions to (enters) the IDLE state 210 upon the following conditions: (1) the device 102 (i.e., the equipment) is stationary (not moving) and a motion timeout has occurred (transition from MOTION SENSOR state 220); (2) a data transfer timeout has occurred, or a data transfer is successful and when it is time for a periodic position report process to begin (transition from DATA TRANSFER state 260); (3) a connection timeout has occurred during the initial communication connection process (transition from MODEM CONNECT state 250); or (4) the device 102 is inside a certain geographic boundary, known as a "geofence," and a geofence timeout has occurred (transition from WAIT FOR OUTSIDE GEOFENCE state 240). The motion timeout is the amount of time allowed to determine if the device 102 is moving. The data transfer timeout is the time allowed for the wireless network module 122 to transfer date to a remote device. The periodic position reporting is the rate at which the device's position is reported (over the wireless module 122 module to a remote device). The connection timeout is the time allowed for the wireless network module 122 to make a communications connection with a remote device. A geofence timeout is the time allowed to determine that the device's position is outside a geofence.

In the IDLE state 210, the device 102 consumes a predetermined or predicted amount of power per unit time (IDLE state power consumption value). A counter, timer or other time measuring device within the device 102 is activated when the IDLE state 210 is entered and deactivated when exited. This enables a determination or measurement of the amount of time device 102 spends in the IDLE state 210. The total time is maintained and stored within the memory 128. The recorded time value may start from initial deployment of the device 102 or from some other selected starting point. Other and/or multiple time periods, as desired, may be tracked and stored in the memory 128. From this, power consumption for the IDLE state is calculated as the amount of time spent in IDLE state (during the relevant time period) multiplied by the IDLE state power consumption value. In most cases, the time period during which the amount of time within the IDLE state 210 is tracked occurs from the initial deployment or redeployment of the device 102 (if the battery is not rechargeable), or in case the battery is rechargeable from the point in time the battery is recharged, to the present time.

When in the IDLE state 210, the amount of time elapsed is recorded. The device 102 remains in this state and transitions from (exits) the IDLE state 210 upon the following conditions: (1) it is time for a periodic motion check (transitions to MOTION SENSOR state 220); or (2) it is time for a periodic GPS check or a periodic position report (transition to GPS FIX state 230). As a result, the device 102 includes functionality for measuring the amount of time spent in the IDLE state 210 (IDLE state time) and may include functionality for calculating IDLE state power consumption based on the IDLE state power consumption value. Alternatively, the IDLE state time information may be transmitted and processed externally to determine the IDLE state power consumption. The periodic motion check is the time to wait before testing the motion sensor for sensed movement. The periodic GPS check is the rate at which the device's position is checked against the geofence, regardless of the motion sensor process.

Referring again to FIG. 2, the device 102 transitions to (enters) the MOTION SENSOR state 220 upon the following condition: (1) it is time for a periodic motion check (transition from IDLE state 210).

In the MOTION SENSOR state 220, the device 102 consumes a predetermined or predicted amount of power per unit time or event (MOTION SENSOR state power consumption value). Similar to the IDLE state 210, a counter, timer or other time or event measuring device is activated when the state is entered and/or deactivated when exited. The total time or number of events is maintained and stored within the memory 128. From this, power consumption for the MOTION SENSOR state 220 is calculated as the amount of time spent in the MOTION SENSOR state or number of events (during the relevant time period) multiplied by the MOTION SENSOR state power consumption value.

When in the MOTION SENSOR state 220, the amount of time elapsed and/or number of times in this state is recorded. The device 102 remains in this state and transitions from (exits) the MOTION SENSOR state 220 upon the following conditions: (1) the device 102 is not moving and a motion timeout has occurred (transition to IDLE state 210); or (2) the device is moving, or it is time for a periodic GPS check or a periodic position report (transition to GPS FIX state 230).

Still referring to FIG. 2, the device 102 transitions to (enters) the GPS FIX state 230 upon the following conditions: (1) it is time for a periodic GPS check or a periodic position report (transition from IDLE state 210); or (2) the device is moving, or it is time for a periodic GPS check or a periodic position report (transition from MOTION SENSOR state 220).

In the GPS FIX state 230, the device 102 consumes a predetermined or predicted amount of power per unit time or event (GPS FIX state power consumption value). Similar to the other states, a counter, timer or other time or event measuring device is activated when the state is entered and/or deactivated when exited. The total time and/or number of events is maintained and stored within the memory 128. From this, power consumption for the GPS FIX state 230 is calculated as the amount of time spent or number of events (during the relevant period) multiplied by the GPS FIX state power consumption value.

When in the GPS FIX state 230, the amount of time elapsed and/or number of times in this state is recorded. The device 102 remains in this state and transitions from (exits) the OPS FIX state 230 upon the following conditions: (1) valid location information is determined (transition to WAIT FOR OUTSIDE GEOFENCE state 240); or (2) a GPS fix timeout has occurred (transition to MODEM CONNECT state 250). The GPS fix timeout is the time allowed to acquire a valid position for the device (e.g., using the GPS module).

The device 102 transitions to (enters) the WAIT FOR OUTSIDE GEOFENCE state 240 upon the following conditions: (1) valid location information is determined (transition from GPS FIX state 230); or (2) a data transfer is successful and not when it is time for a periodic position report process to begin (transition from DATA TRANSFER state 260).

In the WAIT FOR OUTSIDE GEOFENCE state 240, the device 102 consumes a predetermined or predicted amount of power per unit time or event (WAIT FOR OUTSIDE GEOFENCE state power consumption value). Similar to the other states, a counter, timer or other time or event measuring device is activated when the state is entered and/or deactivated when exited. The total time and/or number of events is maintained and stored within the memory 128. From this, power consumption for the WAIT FOR OUTSIDE GEOFENCE state 240 is calculated as the amount of time spent or number of events (during the relevant time period) multiplied by the WAIT FOR OUTSIDE GEOFENCE state power consumption value.

When in the WAIT FOR OUTSIDE GEOFENCE state 240, the amount of time elapsed and/or number of times in this state is recorded. The device 102 remains in this state and transitions from (exits) the WAIT OUTSIDE GEOFENCE state 240 upon the following conditions: (1) the device 102 is within the geofence (transition to IDLE state 210); or (2) the device 102 is outside the geofence or it is time for a periodic position report process to begin (transition to MODEM CONNECT state 250).

Still referring to FIG. 2, the device 102 transitions to (enters) the MODEM CONNECT state 250 upon the following conditions: (1) a GPS timeout has occurred (transition from WAIT GPS FIX state 230); or (2) the device 102 is outside the geofence or it is time for a periodic position report process to begin (transition from WAIT FOR OUTSIDE GEOFENCE state 240).

In the MODEM CONNECT state 250, the device 102 consumes a predetermined or predicted amount of power per unit time (MODEM CONNECT state power consumption value). Similar to the other states, a counter, timer or other time or event measuring device is activated when the state is entered and/or deactivated when exited. The total time and/or number of events is maintained and stored within the memory 128. From this, power consumption for the MODEM CONNECT state 250 is calculated based on the amount of time spent and/or number of events (during the relevant time period) multiplied by the MODEM CONNECT state power consumption value.

When in the MODEM CONNECT state 250, the amount of time elapsed and/or the number of times in this state is recorded. The device 102 remains in this state and transitions from (exits) the MODEM CONNECT state 250 upon the following conditions: (1) a communications connection is established (transition to DATA TRANSFER state 260); or (2) a connection timeout has occurred (transition to IDLE state 210).

The device 102 transitions to (enters) the DATA TRANSFER state 260 upon the following condition: (1) a communications connection is established (transition from MODEM CONNECT state 250).

In the DATA TRANSFER state 260, the device 102 consumes a predetermined or predicted amount of power per unit time and/or number of events (DATA TRANSFER state power consumption value). Similar to the other states, a counter, timer or other time or event measuring device is activated when the state is entered and/or deactivated when exited. The total time and/or number of events is maintained and stored within the memory 128. From this, power consumption for the DATA TRANSFER state 260 is calculated as the amount of time spent and/or number of events (during a relevant time period) multiplied by the DATA TRANSFER state power consumption value.

In another embodiment, the DATA TRANSFER state power consumption value includes two components: transmit power consumption and receive power consumption. These may be calculated independently and each one has its own power consumption value. For example, the transmit power may be based on amount of data and the projected data rate during a transmit DATA TRANSFER.

When in the DATA CONNECT state 250, the amount of time elapsed and/or the number of times in this state is recorded. The device 102 remains in this state and transitions from (exits) the DATA TRANSFER state 260 upon the following conditions: (1) a data transfer is successful and not when it is time for a periodic position report process to begin (transition to WAIT FOR OUTSIDE GEOFENCE state 240); or (2) a data transfer timeout has occurred, or a data transfer is successful and when it is time for a periodic position report process to begin (transition to IDLE state 210).

For each of the states 210-260, the total time, number of events and/or combination thereof is maintained and stored within is stored in memory 128. The recorded time value and/or number of events may start from initial deployment of the device 102 or from some other selected starting point. Other and/or multiple relevant time periods, as desired, may be tracked and stored in the memory 128. From this, power consumption for that state is calculated as the amount of time spent or number of events (during the relevant time period) multiplied by that state's power consumption value. In most cases, the time period during which the amount of time or number of times within that state is tracked occurs from the initial deployment or redeployment of the device 102 (if the battery is not rechargeable), or in case the battery is rechargeable from the point in time the battery is recharged, to the present time. As will be appreciated, the memory 128 may be any suitable memory, and in one embodiment, the memory 128 includes non-volatile memory, such as flash memory. In the event a rechargeable battery is utilized and the device 102 includes functionality for energy harvesting, the total power consumption may require adjustment to take into account the additional energy added to the rechargeable battery. One example of this is when a solar panel is connected to the rechargeable battery and a coulomb counter is monitoring the charging current. The availability of additional energy can be taken into account in determining the projected operational life of the device and/or allowing the device to be reconfigured to provide additional information. In one embodiment, the device 102 would include an energy harvesting device (e.g., solar panel) and a coulomb counter or other means known to those skilled in the art to count or determine the amount of power transferred or added to the rechargeable battery 130. The amount of added energy can be stored in memory of the device 102 for later use and/or transmission to the host server 108.

As described above, the device 102 includes functionality for measuring the amount of time spent and/or the number of times in each state ("_state name_" state time) and may include functionality for calculating that state's power consumption based on that state's power consumption value. This information and/or calculated value is stored in the memory 128. Alternatively, each state's time and/or event information may be transmitted and processed externally to determine that state's power consumption, such as by transmitting this information to the server 108 for storing in the memory 308 and processed.

For the relevant predetermined time period, the power consumption of each state is added together to arrive at a total power consumption of the device 102. As noted, this calculation may be performed by the device 102 (and stored in memory 128) or the server 108 (and stored in memory 308).

The foregoing provides for modeling a device in a state diagram, where each state (and/or transition between states) in the diagram consumes a predictable amount of power. This can be used to determine power consumed by the device during operation (and determine remaining expected battery life), assist in setting original operational parameters (to achieve an expected battery life) or modifying current operational parameters (to change the expected battery life). Entry and exit conditions (for transitions) for each state may be modified to simulate an operational environment, and a resulting battery life expectancy may be calculated. Parameters for entry/exit conditions can be modified in order to achieve the desired battery life (at initialization or during device operation). For example, length of timeouts (e.g., GPS acquisition timeouts), frequency of tasks or operations (e.g., number to try, fails, successes may be variable or programmable, and the amount of data transferred from the device can be modified to reduce transmit power requirements.

In one embodiment, for each state the power consumption (predicted/calculated) may be based on the amount of time in the state and the power consumed per unit time for that state, such as described above with respect to FIG. 2. Total power consumption for the device 102 may be calculated by adding the power consumption for all states.

In another embodiment, instead of recording the amount of time in each state, power consumption may be based on the number of times the state was entered and/or exited (per transition) and the power consumed per entry and/or exit for that state. Only entries, only exits, or both entries and exits, may be tracked and stored for each state. Since entry and exits for a state may be based on different operating conditions or processes, and thus may be associated with different amounts of power, both entries and exits might be separately tracked.

In yet another embodiment, the power consumption may be based on a combination of the two embodiments above. Some states may simply be "waiting" states that consume power based on the amount of time in the waiting state, while other states may have their power consumption based on the number of times the state was entered and/or exited (per transition).

Though not shown, a state may include various tasks or operations (including attempts, failures and successes) within that state and the power consumed may be based on the number of tasks/operations that may take place in that state times and/or the number of times the task/operation was attempted, failed, and/or was successfully performed. In addition, a state (such as shown in FIG. 2) itself may be partitioned to include various sub-states modeled with one or more sub-state diagrams. The sub-states would then have power consumption (per unit time, per entry/exit, per task or operations therein) associated therewith which would provide a total overall power consumption for the state.

In other embodiments, the power consumed may be based on any combination of the foregoing.

As described previously, while the amount of power consumed in each state and during a state transition may not be determined exactly, knowledge of the components and operations performed during each state or transition allow a predictable or predetermined power consumption value to be generated. Results from measuring power consumption during testing/design may also be used to generate the predetermined power consumption value for each state (per unit time, per entry/exit, etc.), each transition, or each task or process.

The state tracking or power consumption tracking process enabling power consumption (ongoing or predicted) of the device 102 to be calculated, as illustrated by the example state diagram of FIG. 2, may be implemented within the device 102 as a state machine (discrete or processor-based), as a separate task or process in a multi-task processing environment, or integrated within the device's operating system or main functional program. The exact configuration and physical implementation may be chosen by those skilled in the art.

The present disclosure teaches partitioning the device's global operation or functioning into a plurality of states (or possibly functions). Each state has associated therewith a predetermined power consumption value. Because the device 102 operates using a battery having a rated power capacity, the operational life of the device (when the battery is not rechargeable) coincides with the battery's power rating (battery life). With knowledge of the expected functioning and operating parameters of device operation (including the rate that certain states, tasks or processes are performed), the operational life of the device 102 can be initially calculated prior to operational deployment. In response to this information, operating parameters and functions may be modified to increase (decrease) the expected battery life, and thus the operational life of the device 102, prior to deployment.

In addition, during actual device operation in the field, by monitoring/tracking the amount of time within a state, the number of times in the state, and/or the number of specific processes or tasks performed within a state, operational power consumption for each state can be calculated for a predetermined period of time. Each state's power consumption may be calculated in this manner and a total operational power consumption for the device 102 is determined for the predetermined period of time (usually from inception/deployment to the present time). With knowledge of the calculated power consumed and the original power available (battery rated power), the amount of remaining battery life and operational life of the device 102 is determinable. In the event the remaining operational life is less than the desired or rated life for the device, certain operating parameters of the device 102 may be modified in the field through wireless communications to the device 102 to cause an increase in its life (time), as desired. This information may also be utilized to determine an approximate time to replace the device's battery before any power shutdown occurs.

In another embodiment, in lieu of transmitting the recorded relevant power consumption state information (and/or up-to-date total power consumption information) to a remote device which, in turn, calculates remaining life and provides operating parameters modification to the device 102 that changes the device's power consumption rate, the device may perform this process (calculations and modifications) internally. The device 102 may include functionality (not shown) to calculate its total power consumption periodically, as described with respect to FIG. 2, calculate its remaining operational life (using stored information of its battery's power rating), and with stored information indicating its targeted operational life, may modify its own operational parameters to achieve this target. The calculated remaining battery life information may also be transmitted to the server 108 to provide notification of the end of life date which may be compared against an expected number stored in the server 108 for that device 102, and further action may be taken (as described herein).

Figure 3:
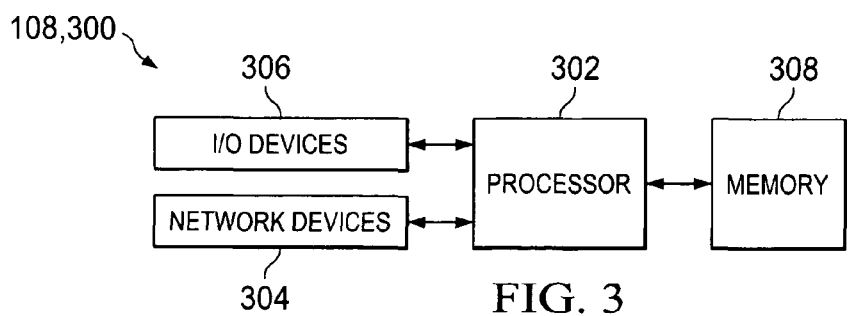
FIG. 3 is a block diagram of a server or computer-based processing system in accordance with the present disclosure.

Now referring to FIG. 3, there is shown a block diagram of the server 108 (referred to generically as a computer-based processing system 300) implemented with components and software/firmware providing sufficient processing power, memory resources, input/output devices and network interface capabilities. The processing system 300 is suitable for implementing one or more embodiments disclosed herein. The processing system 300 can be configured and utilized to operate and function as: (1) a conventional host server communicating with the GPS tracking device 102 (e.g., receiving data); (2) a power consumption estimator (for initial programming of operating parameters for the device 102); (3) a real-time power consumption monitor and adaptor (for determining power consumption of the deployed device 102 and adapting/reprogramming its operating parameters); and/or (4) a graphical user interface (GUI) for representation of different device configurations (operating parameters) and the effect of these different configurations on battery life. It will be understood that a single processing system 300 may include functionality to perform all of the above, or two or more separate systems 300 may be used, as desired.

The processing system 300 includes a processor 302 (which may be referred to as a central processing unit or CPU) in communication with memory 308, input/output (I/O) devices 306, and network connectivity devices 304.

Memory 308 may include volatile (e.g., RAM, etc.) and or non-volatile memory (e.g., ROM, flash, hard disk drives, etc.). The memory 308 is used to store computer programs, instructions and other data. The I/O devices 306 may include printers, video monitors, liquid crystal displays (LCDs), touch screen displays, keyboards, keypads, switches, dials, mice, track balls, voice recognizers, card readers, paper tape readers, or other known input devices. The network connectivity devices 304 may take the form of one or more modems, modem banks, Ethernet cards, network interface cards (NICs), universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and/or other known network devices. These network connectivity devices 304 enable the processor 302 to communicate with network 114. The processor 302 executes instructions, codes, computer programs, and/or scripts accessed from memory 308 or the network connectivity devices 304, and processes data.

The operation and structure of the processing system 300 is well-known to those of ordinary skill in the art. The processing system 300 includes the foregoing components and functionality, and no additional description of the components and software processes (functionality) of a server or processing system, other than as noted herein or relevant for an understanding of the present disclosure, is provided, as these are known to those of ordinary skill in the art. It will be understood that the processing system 300 may be constructed or configured from any suitable hardware, software, firmware, or combination thereof for providing the functionality known to those of ordinary skill in the art. The processing system 300 will include additional functionality or perform additional method(s) or process(es) described herein in accordance with one or more embodiments.

The global functioning of the GPS tracking device 102 is partitioned into a plurality of states to form a state diagram (e.g., FIG. 2). Each state (and/or transitions between states) represents a particular function or process, and each state has associated therewith a power consumption value. Programmable operating parameters, such as timeouts (waiting for a time period to perform a function or wait for an event to occur), periodic checks or reports, frequency of operation and site specific operating parameters, such as time to acquire GPS, time to acquire wireless connection, and frequency of motion detection, define the overall operation of the device 102. The frequency in which (and amount of time necessary to perform) tasks, checks, and reporting are scheduled to occur, the length of programmed timeouts and other operations affect power consumption in the device 102. For example, periodic reporting to the host server 108 at every thirty minutes versus every sixty minutes would increase power consumption resulting from periodic reporting by a factor of two.

Once the state diagram is configured and power consumption values are associated with each state or transition, this modeling can be utilized to explore a different number of operating parameter configurations (operational profile) and the effect of these configurations on battery life prior to deployment (using processing system 300). This enables a user to input operating parameters, process the parameters, and view the battery life resulting from that set of operating parameters. From this, a user may select an appropriate set of operating parameters to meet a certain battery life requirement for the device 102. As will be appreciated, the term "set" may include one or more operating parameters.

After deployment and device activation, this modeling and actual tracking (monitoring) of state and state transitions within the device 102 enables real-time monitoring of power consumption (battery capacity consumed), recalculation of remaining battery life based on the currently programmed operating parameters and observed conditions, and modification of the device's operating parameters, if necessary, to achieve the desired battery life (i.e., operational life of device 102).

Now referring to FIGS. 4A through 4D, there are depicted several different example windows or pages 402, 404, 406, 408 within a GUI 400 of the host server 108. The server 108 includes various processes for generating these GUI windows in accordance with a power optimization application program (not shown) executing within the computing system 300 of the server 108. In general, the GUI 400 provides a display of, and control over, various operational parameters of the device, including reporting intervals, general device behavior and device configuration parameters (as described herein), and also simulation models. The GUI windows are configured to enable user input and display of variables and other information.

As shown, each window 402, 404, 406, 408 includes a frame 410 having a Load Device field 412 for input/display of a unique device identifier (e.g., identifier for a device 102) and a plurality of buttons 414 for initiating various actions, including Reset, Set to Default, Save and RT Toggle. Each window also includes a frame 420 for enabling visualization of certain information including battery life 422, projected battery life 424, observed battery usage 426, and a table 430 providing values of total power consumed by each of a plurality of states or modes, such as an IDLE state or mode 432, a motion detection state or mode 434, a GPS state or mode 436 and a GSM (wireless communications) state or mode 438. The data in these fields is the calculated power consumption (per time period) based on a desired set of operating parameters (i.e., historical device information is unavailable) or the actual set of operating parameters of the device 102 deployed in the field. Though only four are shown, fewer or additional states or modes may be included and shown.

The default battery life is based on a theoretical power model, using measured values in one or more typical operational scenarios and configured device parameters, the theoretical battery capability, and/or any power that may be locally available (e.g., energy harvesting). Observed battery life is determined based upon observed device performance, and assumes that device parameters remain as currently configured. Projected battery life is determined based upon observed performance, and is modified as directed by GUI manipulations.

The default battery life 422, the projected battery life 424 and the observed battery usage 426 are shown each having a bar graph 440 and a numeric field 442 indicating a respective value for a time period (e.g., months) or as a percentage of the default battery life, as shown. The observed battery usage 426 provides an indication of the total power consumption of a device 102 deployed (or previously deployed) in the field. As will be appreciated, this value is the total power consumption of the device 102 as calculated and described above (based on the device's power consumption data transmitted to the server 108).

Each window 402, 404, 406, 408 also includes a frame 450 having an area in which one or more variable operating parameters 452 associated with the particular state or mode are displayed, and the GUI window is configured to enable user input capability to change/modify the variable (i.e., programmable) parameters 452, as shown.

Figure 4A:
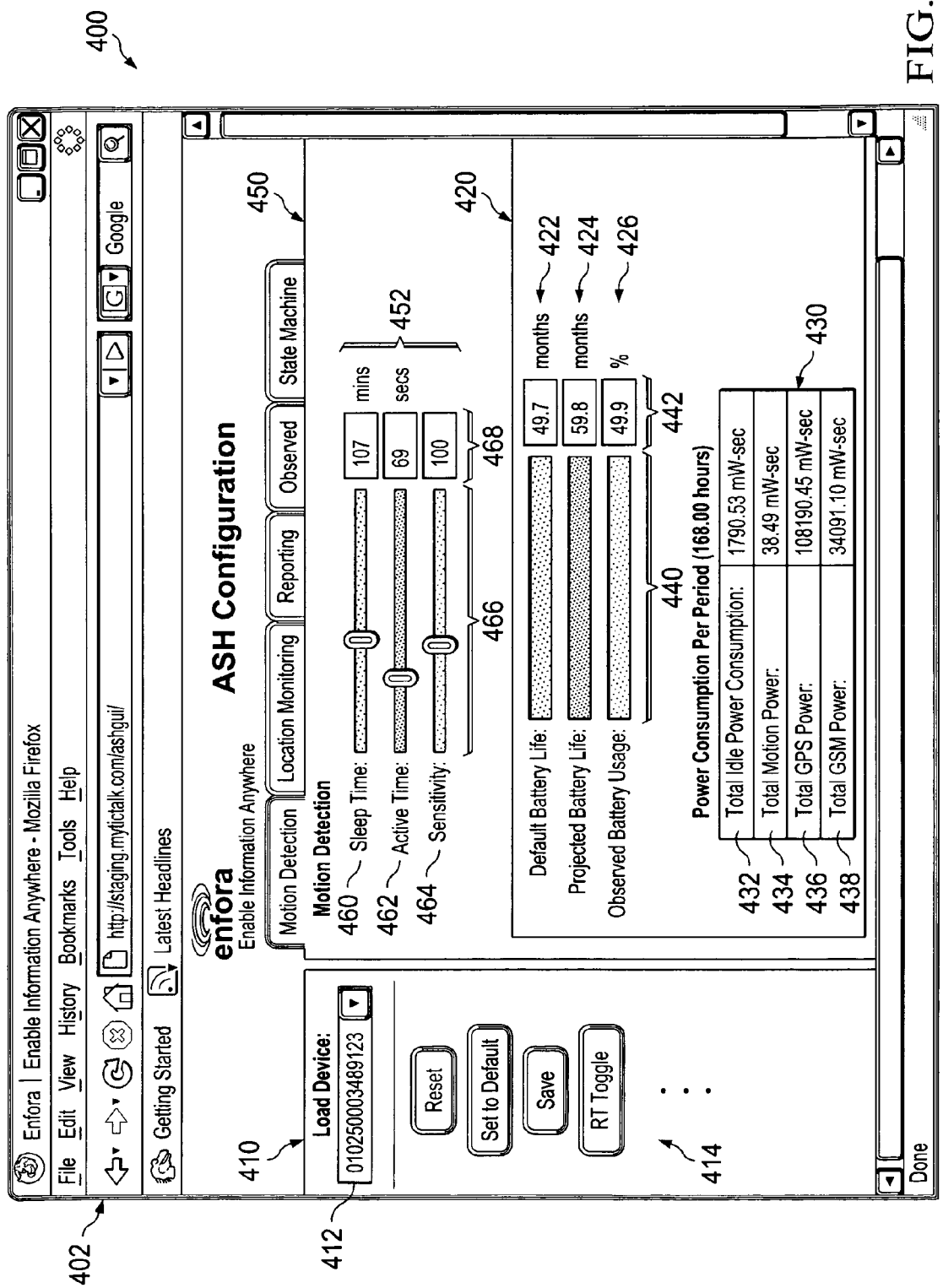
FIGS. 4A through 4D depicted four example windows or pages within a graphical user interface of the server.

As shown by FIG. 4A, the variable operating parameters 452 within the frame 450 of the window 402 includes three parameters relating to the motion detection mode: a sleep time parameter 460, an active time parameter 462 and a sensitivity parameter 464. The sleep time parameter 460 is the amount of time in the IDLE state 210 before initiating a periodic motion check. The active time parameter 462 is the amount of time in the MOTION SENSOR state 220 before initiating a transition to the WAIT FOR GPS FIX state 230. The sensitivity parameter 464 is the amount of motion required to determine movement in the MOTION SENSOR state 220 Each parameter 460, 462, 464 is shown having a sliding scale 466 and a numeric input/display field 468 indicating a respective value for that parameter. Including both the sliding scales 466 and fields 468 allow a user to adjust the parameter in different manners, as known to those skilled in the art. It will be understood, changing or modifying the data in one or more fields 468 within window 402 will likely change the power consumption calculations.

Figure 4B:
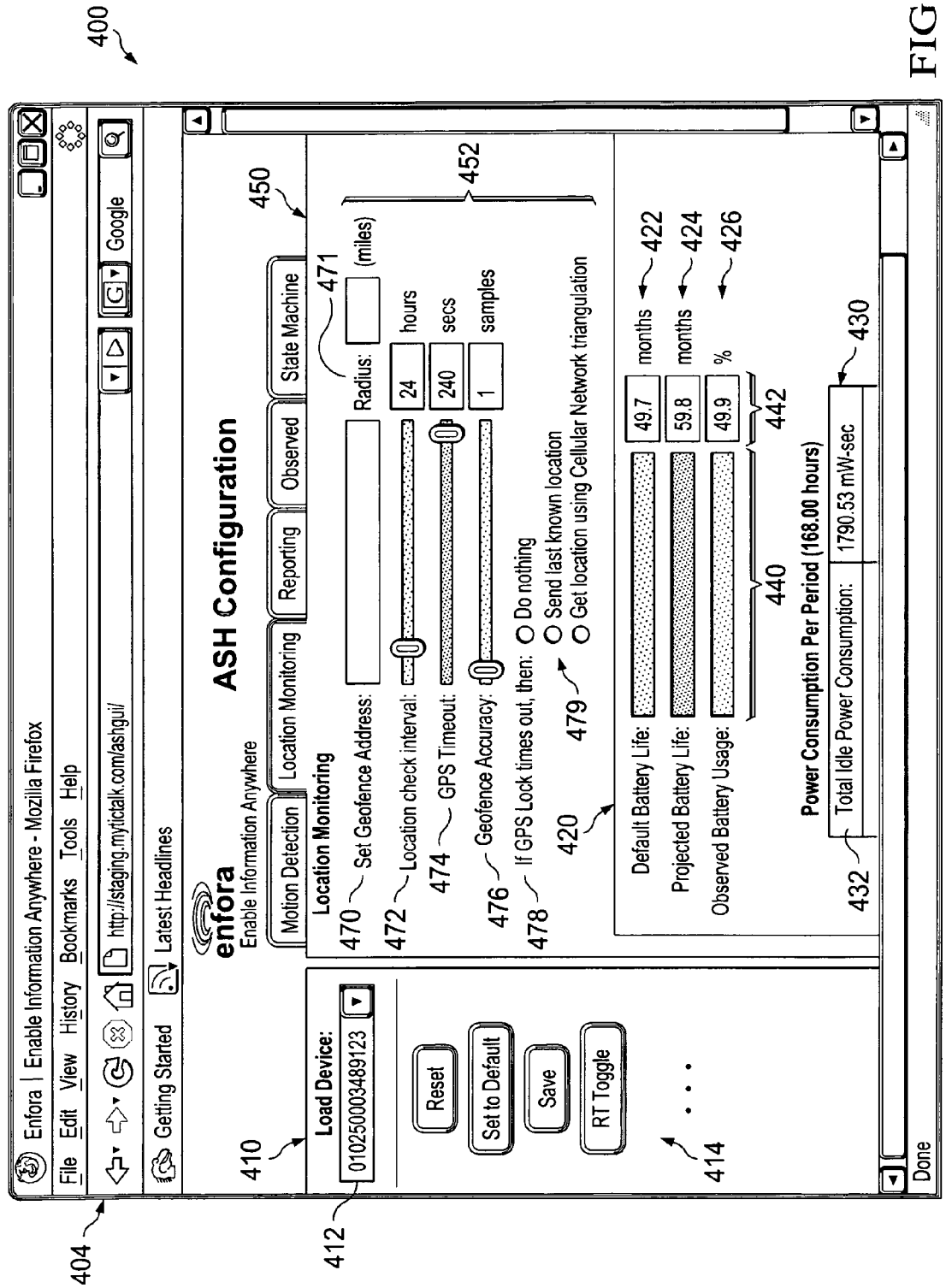

Now referring to FIG. 4B, as shown, the variable operating parameters 452 within the frame 450 of the window 404 includes six parameters relating to the location monitoring mode (GPS mode): a geofence address parameter 470, a geofence radius parameter 471, a location check interval parameter 472, a GPS timeout parameter 474, a geofence accuracy parameter 476, and a second GPS timeout parameter 478. The geofence address parameter 470 typically identifies a point that defines the center location of a geofence, while the geofence radius parameter 471 defines the area around the geofence address, which are used for determine whether the device 102 is inside or outside the geofence (in the WAIT FOR OUTSIDE GEOFENCE state 240). The location check interval parameter 472 defines the amount of time between GPS location checks when in the IDLE state 210. The GPS timeout parameter 474 defines the amount of time in the WAIT FOR OUTSIDE GEOFENCE state 240 before declaring an "outside geofence" event. The geofence accuracy parameter 476 defines the number of samples indicating that the device is within the geofence before declaring an "inside geofence" event in the WAIT FOR OUTSIDE GEOFENCE state 240. The second GPS timeout parameter identifies what action to take when the GPS process timeouts without a fix.

Each parameter 472, 474, 476 is shown having a sliding scale 466 and a numeric input/display field 468 indicating a respective value for that parameter (see FIG. 4B). The geofence address parameter 470 and the geofence radius parameter 471 are shown having a numeric input/display field 470a and a numeric input/display field 471a, respectively. The second GPS lock parameter 478 includes a plurality of checkboxes 479 allowing selection of a particular action to be taken by the device 102 when a GPS lock timeout occurs. Example actions may include (1) taking no action, (2) sending the last known position information to a remote device (e.g., the server 108), or (3) perform a secondary location determining method (using cellular triangulation). Other suitable actions may be configured to be selected, as desired. Changing or modifying the data in one or more fields 468 or the checkboxes 479 within the window 404 will likely change the power consumption calculations (though changing the geofence address may or may not result in more or less power consumption).

Figure 4C:
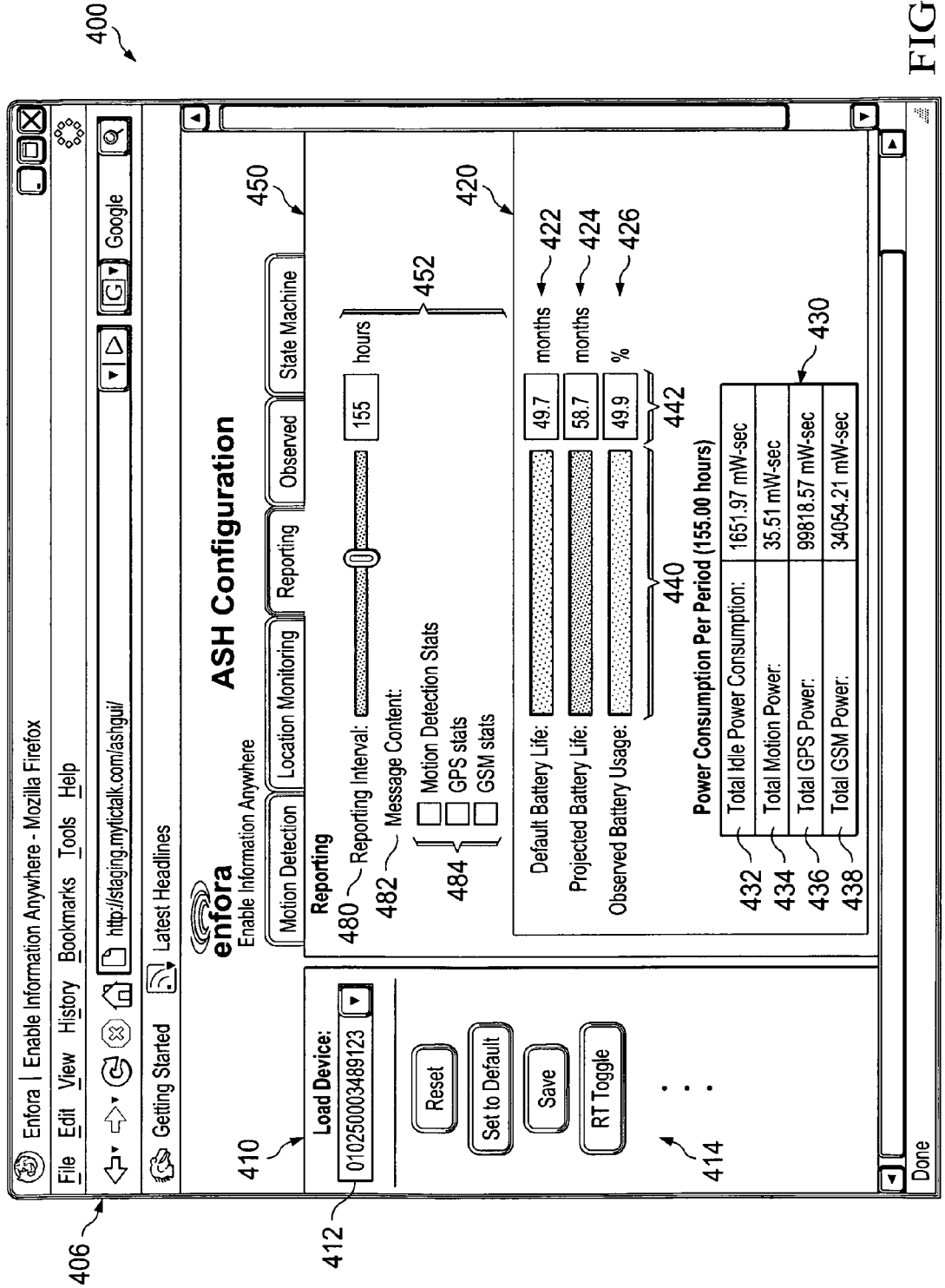

Now referring to FIG. 4C, as shown, the variable operating parameters 452 within the frame 450 of the window 406 include two parameters relating to the communication or reporting mode (GSM mode): a reporting interval parameter 480 and a message content parameter 482. The reporting interval parameter 481 defines the amount of time between periodic position reports when in the IDLE state 210. The message content parameter 482 defines parameters that configure the device 102 to transmit measured statistical information (power consumption information (raw data or the observed power estimate calculated by the device 102 itself)) to the host server 108. Though this provides the statistical information to the host server 108, it also increases power consumption due to the need for longer data transmissions.

The parameter 482 is shown having a sliding scale 466 and a numeric input/display field 468 indicating a respective value for that parameter (see FIG. 4C). The message content parameter 472 includes a plurality of checkboxes 484 allowing selection of the type and content of data that will be reported. Examples of transmitted data include (1) motion detection data, (2) GPS (location) data, and/or (3) GSM (communications) data. Other data may also be listed for selection, as desired. Changing or modifying the data in one or more fields 468 or the checkboxes 484 within the window 404 will likely change the power consumption calculations.

Figure 4D:
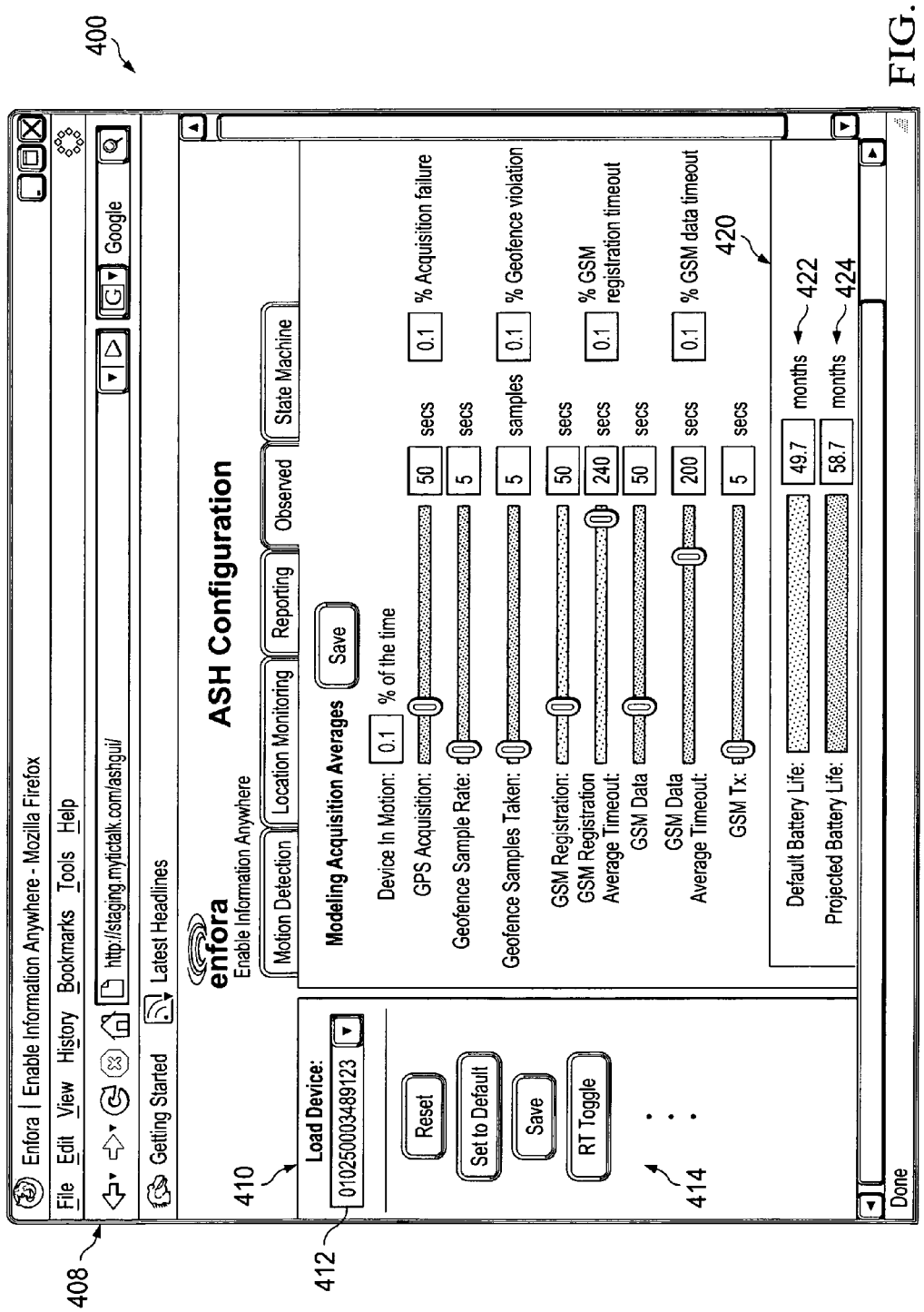

Now referring to FIG. 4D, as shown, the variable operating parameters 452 within the frame 450 of the window 408 include a plurality of advanced parameters for configuring additional device settings used to simulate the operational environment of the device 102. These additional device settings include: (1) GPS Acquisition parameter is the projected time required for a typical GPS fix; (2) Geofence Sample Rate parameter is the rate at which samples of location are extracted in the WAIT FOR OUTSIDE GEOFENCE state 240; (3) Geofence Samples Taken parameter is the typical number of location samples that are utilized to determine presence inside a geofence in the WAIT FOR OUTSIDE GEOFENCE state 240; (4) GSM Registration parameter is the average time taken to establish a connection in the wireless network in the MODEM CONNECT state 250; (5) GSM Registration Average Timeout parameter is the average amount of time for the connection timeout in the MODEM CONNECT state 250; (6) GSM Data is the average amount of time spent in the DATA TRANSFER state 260; and (7) GSM Tx parameter is the average time to transmit data in the DATA TRANSFER state 260.

In addition, the expected probabilities of timeout events are modeled. These probabilities include: (1) Device in Motion parameter (used in simulation) is the percentage of time motion is expected to be detected in the MOTION SENSOR state 220; (2) % Acquisition Failure parameter (used in simulation) is the percentage of time the GPS timeout is expected to occur WAIT FOR GPS FIX state 230; (3) % Geofence parameter (used in simulation) is the percentage of time the device is detected to be outside the geofence in the WAIT FOR OUTSIDE GEOFENCE state 240; (4) % GSM Reg Timeout parameter (used in simulation) is the percentage of time that a connection timeout is detected in the MODEM CONNECT state 250; and (5) % GSM Data (used in simulation) is the percentage of time that a transfer timeout occurs in the DATA TRANSFER state 260. These parameters are used to calculate the default battery life in the absence of observed device parameters, and are replaced with observed parameters in order to calculate the observed battery life and projected battery life.

It will be understood by those skilled in the art that any number, nature and type of variable operational parameters 452 may be utilized based on the type or functionality of the battery-operated device. Fewer or additional parameters 452 may be configured than the example parameters shown in FIGS. 4A through 4D (and described above).

Each of the variable operational parameters are included in a set of operational parameters currently configured for a deployed device 102 or that are in the process of being determined to provide an initial pre-deployment configuration for a device 102. By modifying/changing a parameter value, the power optimization application program recalculates the projected power consumption (and projected battery life) enabling visualization of the impact(s) on the projected battery life caused by modifying a parameter value. Thus, when the parameter value(s) are dynamically changed, the resulting effect on power consumption/battery life is calculated and displayed via the GUI 400. As will be appreciated, the power optimization application program calculates the projected power consumption and projected battery life by processing the currently configured parameters using a particular power model (e.g., state diagram) applicable to the device (such as the device 102). This power optimization process can be done to calculate a projected battery life (of the battery 130 within the device 102), and thus the operational life of the device 102, prior to deployment. Parameters can be modified to adjust the calculated power consumption to attain a desired operational life (projected battery life) for the device 102. Once a set of operational parameters is determined that meets the desired battery life, the device 102 may be configured with these parameters and deployed to the field (initial configuration).

Initial configuration of the parameters within the device 102 (in the settings may be accomplished in any suitable manner, and in one embodiment, the host server 108 programs the parameters by transmitting them to the device 102 via wireline or wireless communications which are stored as the operational parameters settings 118 in the memory 128, thus programming certain device operations. The set of operational parameters may also be programmed into a programmable device and incorporated into the device 102.

If the device is deployed and actual/observed power consumption and device id information is transmitted to the server 108, the program can process this information in conjunction with the known current set of operational parameters and calculate the projected battery life/operational life of the device 102. The known current set of operational parameters may be retrieved from the server 108 (stored in memory 308 at the time of initial configuration) or may be sent from the device 102 itself (stored in memory 128) to the server 108. This calculation is done using the actual/observed power consumption information and a calculated projected remaining life based on current operating parameters. For example, if the device 102 has been detected to be in motion 1 percent of the time, while the default configuration was 0.1 percent, a significant increase in power consumption would be observed. If the new projected battery life is insufficient to meet the desired operational life of the device 102, parameters can be modified to adjust the power consumption rate to attain the desired operational life for the device 102. Once a set of parameters is determined, either the full set or only those parameters having been modified, the device 102 may be configured with these parameters in any suitable manner (deployed reconfiguration).

In one embodiment, the set of parameters are transmitted to the device 102 via a communications link (wireless, wireline or combination thereof). In one particular embodiment, the server 108 transmits the operating parameters to the device 102 in a data packet along with one or more commands instructing the device 102 to store the new parameters in the operating parameters settings 118 of the memory 128 (thereby replacing one or more current parameters). Thereafter, the device 102 operates in accordance with the modified parameters.

Various methods and processes will now be described as performed by the overall system 100, the GPS tracking device 102 and/or the host server 108.

Figure 5:
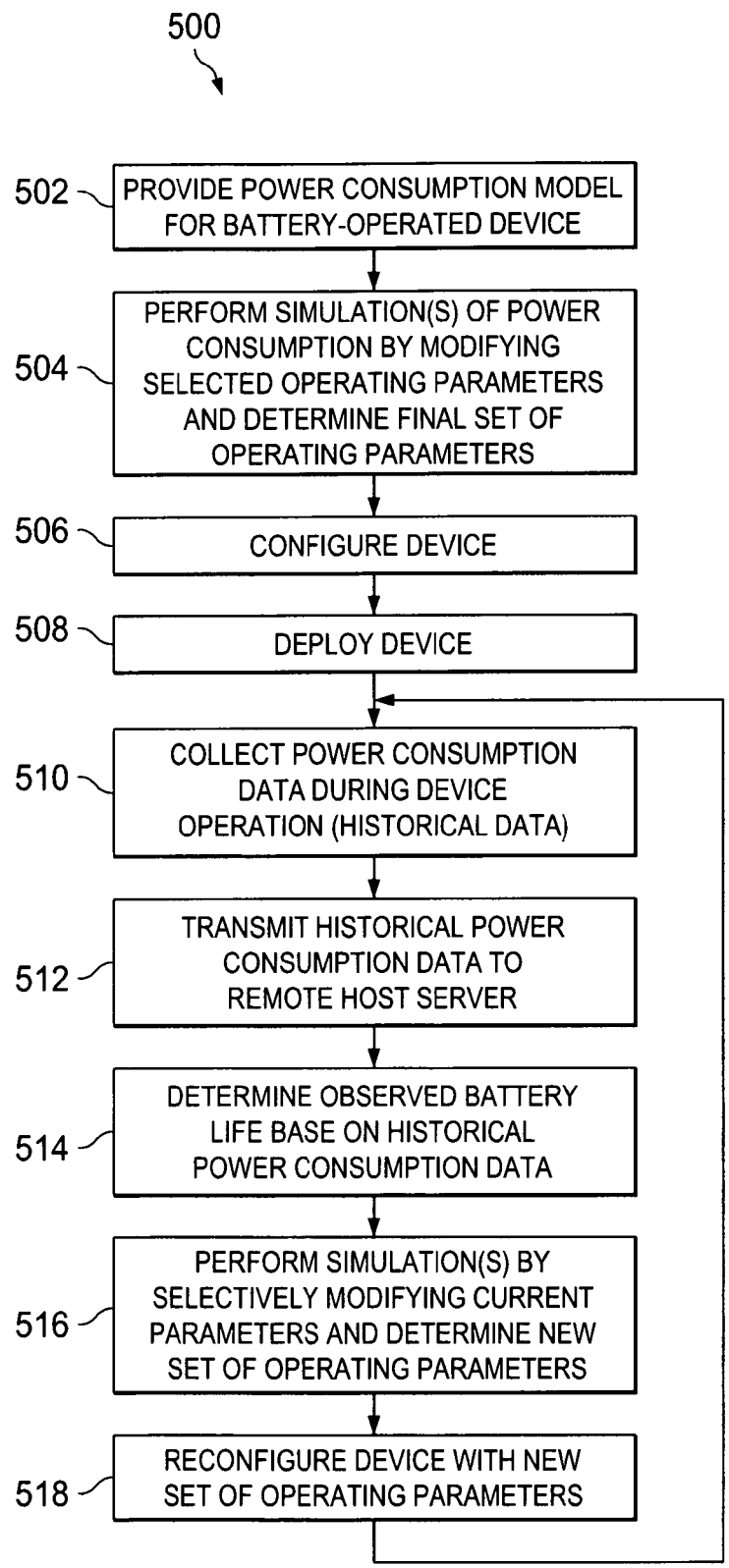
FIG. 5 is a flow diagram illustrating a method performed within the system shown in FIG. 1 in accordance with the present disclosure.

Now turning to FIG. 5, there is illustrated a method or process 500 (projecting, estimating and controlling power consumption of a battery-operated device) executed or performed by the system 100. The method 500 provides a power consumption management control process for a battery-operated device (e.g., device 102) and will be described from an initial simulation/configuration of the GPS tracking device 102 to monitoring/controlling power consumption in the device 102.

Initially, a power consumption model is determined based on the unique characteristics and functionality of the device 102. The power consumption model provides the underlying means or method that enables initial configuration of operating parameters, monitoring of the various processes/tasks/functions performed by the device 102 during operation, calculating observed power consumption, and modifying operating parameters during device operation. To develop the power consumption model, device operation and knowledge of all operable functions (and parameters that affect these functions) of the device 102 is known and utilized to create a process or state diagram corresponding to device operation. All processes/tasks/functions are partitioned into separate states and attributed a predetermined power consumption value representing an amount of power that will be consumed during execution of each of the separate states. One example of such a model is described with respect to FIG. 2 (and the accompanying text). In that example, the power consumption model is represented as a state diagram having multiple states having entries and exits (transitions). It will be understood that the states and transitioning conditions are determined based on the functionality of the device 102. The predetermined power consumption values may be obtained as described previously.

As will be appreciated, after development of the power consumption model, it may be implemented as a power consumption computer program within a computing device, such as the server 108. Persons of ordinary skill in the art will be able to design and implement a computer program to reflect the known power consumption model of the device 102, such as for example, utilizing the state diagram model, the predetermined power consumption values, and the device operating parameters (variable or fixed).

Now referring to FIG. 5, after development of a computer program implementing the known power consumption model of the battery-powered device 102 (Step 502), simulation(s) of the expected or projected power consumption of the device 102 are performed using one or more sets of operating parameters (Step 504). These operational parameters may be input directly through I/O devices of the host server 108 or may be obtained from one or more stored sets of default parameters through use of the GUI 400. Other input means and display means may be utilized. As will be appreciated, the relevant operational parameters may be initially and/or continuously displayed to the user through the GUI 400 (or other output device).

In one embodiment, simulation includes calculating a default battery life based on a first set of device operating parameters and calculating a projected battery life based on a second set of operating parameters. The projected battery life may also be referred to as the operational life of the device 102 (based on operation powered by a particular battery). As previously described, the first set of parameters may be based on one or more typical operational scenarios each associated with a set of default device parameters that has been manually input or previously stored (in memory 308) in the host server 108. Further, this initial set may be retrieved from memory 128 of the device 102 through a communications link (wire, wireless) between the device and an communications interface within the server 108. The default battery life will also depend on the power capacity of the battery 130 of the device 102. Battery power capacity may be input separately using the GUI or set as one of the default device parameters.

Initially, the projected battery life will equal the default battery life (because the first initial set of operating parameters is used to initially calculate both). After the device has been operational for a period of time (as described further below), or a more accurate model of the device becomes available, the battery life is recalculated based upon observed historical data (e.g., numbers of timeout event, avert time for GPS Acquisition, etc.) and the current configuration. Since this new model is more accurate than the original model, this "observed" battery life may differ from the default battery life, and may need to be modified in order to operate as desired. Next, a user may modify one or more parameters within the initial first set of parameters to generate a second or modified set of parameters via the GUI 400 (illustrated in FIGS. 4A-D), and a new projected battery life is calculated and displayed (or otherwise output or conveyed to the user). As will be appreciated, one or more parameters may be changed prior to recalculation of the projected battery life. As operating parameters are modified, the user sees (in the display) the effect the changed parameter(s) have on the projected battery life—thus enabling simulation of any number of different device operational scenarios for device 102.

Depending on the environmental and operational conditions, a user may desire certain selected operating parameters to be set in such a way so as to provide a desired functionality for the device 102 (e.g., reporting intervals, type and amount of data reported, frequency of acquiring GPS location information, etc.). In accordance with the teachings herein, the user sets the desired operating parameters and a new projected battery life is calculated. Once determined, the projected battery life may be acceptable or unacceptable (i.e., meets or exceeds a desired battery life or operating life for the device).

Figure 6:
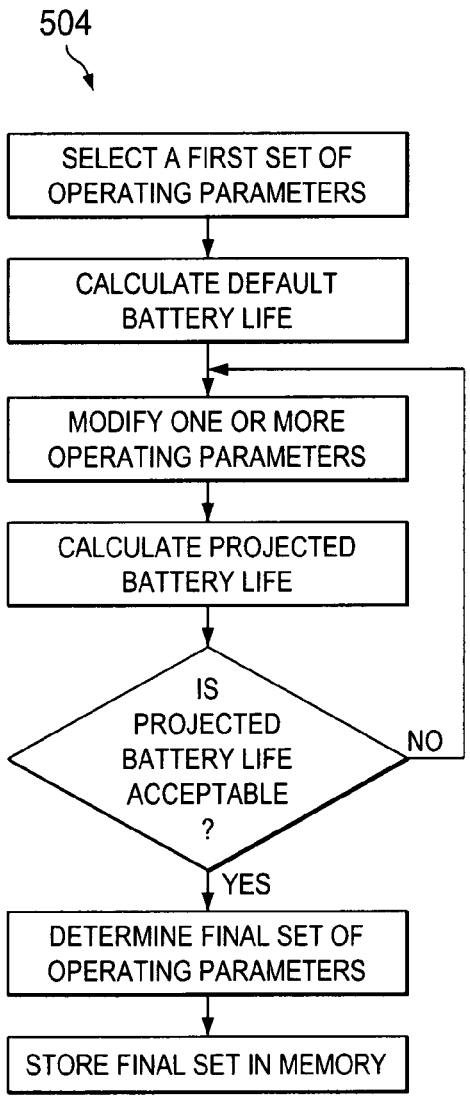
FIG. 6 is a more detailed flow diagram illustrating the simulation process and determination of a set of operating parameters (initial configuration) set forth in FIG. 5.

If acceptable, the current set of parameters is final and the device 102 is ready for initial configuration. If unacceptable, one or more of the same or other parameters may be modified. Through simulation encompassing various iterations and recalculations using different sets of operating parameters or modified parameter(s) (one or more), it is expected that a final set of operating parameters will be determined which meet the desired battery life. It will be understood that a single or multiple parameters may be modified at one time. Further, the relevant operational parameters may be initially and/or continuously displayed to the user through the GUI 400 (or other output device) during this process. Once a final set of operating parameters is determined, this set of parameters is associated with a unique identifier for the device 102 and stored in memory 308 within the host server 108 for later use. Referring to FIG. 6, there is shown a flow diagram illustrating in more detail the simulation process and determination of a final set of operating parameters, as described above (controlling power consumption).

The device 102 is then initially configured (programmed) with this final or operational set of parameters (Step 506) which are stored in the settings 118 portion of the memory 128. The process of initially configuring the device 102 may be implemented or accomplished in any suitable manner, including those described previously. It will be understood that device 102 may be configured (programmed) with a default set of operating parameters (may be deemed the initial parameters), such as during manufacturing of the device, and configuring the device may include replacing the entire set of default parameters with the final set of operating parameters or replacing only those default parameters that have been modified during the simulation.

In another embodiment, the device 102 may be deployed prior to initial configuration, and this final set of operating parameters may be sent to the device 102 after deployment.

After initial configuration, the GPS tracking device 102 is deployed (Step 508) to a location remote from the host server 108, per the desired application, and rendered operational. In the example GPS tracking application, the device 102 is attached or mounted to another apparatus/device (commonly referred to as an "asset") for tracking. In this application, the asset and device 102 are mobile and typically move between various remote locations.

Once operational, the GPS tracking device 102 executes one or more operational program(s) or process(es) in accordance with its intended application and the configured set of parameters (an operating mode). During operation, the device 102 collects information related to power consumption (power consumption data) (Step 510). More specifically, the number of times each state is entered/exited, the amount of time spent in each state, the quantity of occurrences of each exit criteria (e.g., event timeout or geofence violation) and other power affecting activity (e.g., temperature at time of operations or distance from GSM cell tower), is monitored and stored in memory 128. This data or information is referred to as the historical power consumption data. This process may operate as a state machine (in accordance with the state diagram shown in FIG. 2) and/or as a separate task within a multi-task environment. In other embodiments, this procedure may be as simple as detecting and storing the number of times each relevant event, process or task is attempted and/or successfully completed. In yet other embodiments, this procedure may be accomplished by measuring current consumption directly, such as with a coulomb counter, providing even more precise power consumption measurements.

Figure 7:
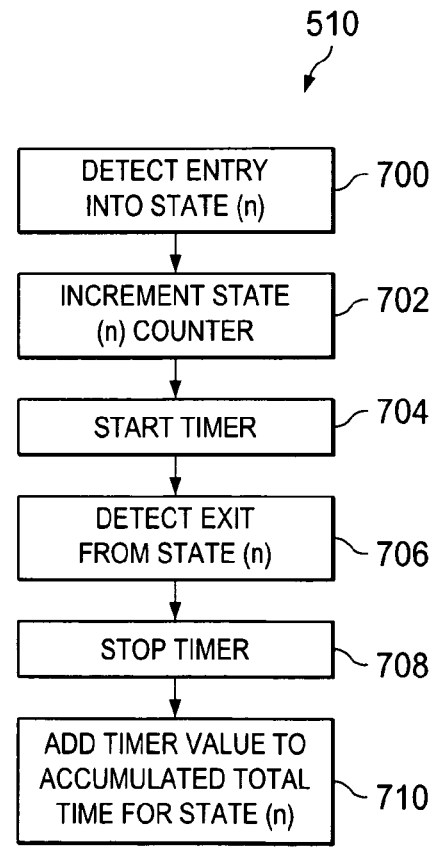
FIG. 7 is a more detailed diagram illustrating the process for monitoring and collecting historical power consumption data as set forth in FIGURE.

Now referring to FIG. 7, there is a more detailed diagram illustrating the monitoring and collection of the historical power consumption data.

Data collection for a particular state(n) begins when entry (i.e., transition) into state(n) is detected (Step 700). A state(n) counter is incremented (Step 702) and a timer is started (Step 704). At some point, an exit (i.e., transition) out of state(n) is detected (Step 706). The timer is stopped (Step 708) and the timer value is added to an accumulated total time for state(n) (Step 710). As will be appreciated, the counter(s) may be implemented utilizing any suitable circuitry and/or firmware/software, such as one or more dedicated registers or other memory storage locations. Similarly, the timer(s) may be implemented utilizing any suitable circuitry and/or firmware/software. It will be understood that the number of states "n" depend on the specific configuration of the power consumption model and state diagram configured for the device 102.

During device operation, the historical power consumption data is sent or transmitted to the remote host server 108 (Step 512). Transmission may occur periodically, as programmed, in response to a request received from the host server 108 or in response to the occurrence of an particular event. In one embodiment, the historical power consumption data may be transmitted wirelessly or via wireline (or combination thereof). In another embodiment, this data is transmitted from the device 102 and stored in an external storage device (not shown) via an electrical interface or short-range wireless interface (infrared, BlueTooth, WiFi, etc.) configured in the device 102. The external storage device may then be delivered to the remote host server 108 and downloaded thereto, or may be taken to a remote terminal (not shown) operable for downloading the data to the server.

In another embodiment, the GPS tracking device 102 may be programmed with the power consumption model and the predetermined power consumption values for each state/process/function/task. In this implementation, the GPS tracking device may calculate the "observed" real-time consumption of power based on the collected historical power consumption value, and the power consumption data sent to the host server 108 may be this calculated observed power consumption.

The server 108 receives the historical power consumption data and calculates the "observed" power consumption for device 102. This calculation is based on the programmed power consumption model, the predetermined power consumption values for each state/process/function/task and the historical power consumption data received from the device 102. For example, the total amount of time (and/or number of times the actions/tasks are performed) measured for the device 102 to perform the various actions/tasks, such as MOTION SENSOR, GPS FIX, WAIT FOR OUTSIDE GEOFENCE, MODEM CONNECT, and DATA TRANSFER (as described in detail herein), may be utilized to determine an average time to perform the action/task (or total time for that activity, such as IDLE state). Then, based on this, the observed power consumption may be calculated. This may be displayed through the GUI 400 or other output means.

The host server 108 may identify the device 102 and retrieve the current set of operating parameters that were previously stored in the host server at initial configuration (or reconfiguration). Alternatively, the device's current set of operating parameters may be transmitted from the device 102 along with the historical power consumption data. Based on the current operating parameters, the calculated observed power consumption, the programmed power consumption model, the predetermined power consumption values for each state/process/function/task and the historical power consumption data received from the device 102, the observed battery life may be calculated (Step 514). The observed battery life indicates the amount of total life left for the battery under current device conditions (historical data and currently programmed operating parameters). As will be appreciated, the values of the observed power consumption, the observed battery life, and the relevant operational parameters may be initially and/or continuously displayed to the user through the GUI 400 (or other output device) during this process.

Initially, the projected battery life equals the observed battery life. In the event the projected battery life is acceptable (e.g., meets or exceeds the originally desired battery life at initial configuration or a newly determined desired life), then no further action is required in order to meet the projected battery life and the device 102 may continue operating in accordance with its current set of operating parameters.

If the new projected battery life is unacceptable and does not meet the desired battery life (e.g., the originally desired battery life at initial configuration or a newly determined desired life), simulation(s) of the expected or projected power consumption of the device 102 are performed using one or more sets of modified operating parameters (Step 516). In accordance with the teachings herein, the user sets the desired operating parameters and a new projected battery life is calculated. Once determined, the projected battery life may be acceptable or unacceptable. If acceptable, the current modified set of parameters becomes final and the device 102 is ready for re-configuration. If unacceptable, one or more of the same or other parameters may be modified.

The user may modify one or more parameters within the current set of parameters to generate a second or modified set of parameters via the GUI 400 (illustrated in FIGS. 4A-D), and a new projected battery life is calculated and displayed (or otherwise output or conveyed to the user). As will be appreciated, one or more parameters may be changed prior to recalculation of the projected battery life. As operating parameters are modified, the user sees (in the display) the effect the changed parameter(s) have on the projected battery life—thus enabling simulation of any number of different device operational scenarios for device 102 for future operation.

Through simulation encompassing various iterations and recalculations using different sets of operating parameters or modified parameter(s) (one or more), it is expected that a final set of operating parameters will be determined which meet the desired battery life. It will be understood that a single or multiple parameters may be modified at one time. Further, the relevant operational parameters may be initially and/or continuously displayed to the user through the GUI 400 (or other output device) during this process. Once a final set of operating parameters is determined, this set of parameters is associated with the unique identifier for the device 102 and stored in memory 308 within the host server 108 for later use. Referring to FIG. 8, there is shown a flow diagram illustrating in more detail the simulation process and determination of a final set of operating parameters, as described above, for re-configuration of the device 102 (controlling power consumption).

The device 102 is then re-configured with a new or modified operational set of parameters (Step 518) which is stored in the settings 118 portion of the memory 128. Referring to FIG. 9, there is shown a flow diagram illustrating in more detail the process for re-configuring the device 102 (for controlling power consumption), which may be implemented or accomplished in any suitable manner, including those described previously (with respect to initial configuration).

Typically, the device 102 is deployed in the field. In this event, the entire set of modified operating parameters or only the modified parameters are sent from the host server 108 to the device 102 (Step 900). This data may be transmitted wirelessly or via wireline (or combination thereof). In another embodiment, this data is transmitted from the host server 108 and stored in an external storage device (not shown) via an electrical interface or short-range wireless interface (infrared, BlueTooth, WiFi, etc.) configured in the host server 108. The external storage device may then be delivered to the GPS tracking device 102 and downloaded thereto (in the same or similar manner). The modified parameter(s) are received at the device 102 (Step 902) and stored in the settings 118 portion of the memory 128 (Step 904). The device 102 operates in accordance with the modified parameter(s) (Step 906) (an operating mode) to control power consumption in the device 102.

The following is an example illustrating a method of configuring (or re-configuring) operating parameters of the GPS tracking device 102 to achieve a given power consumption rate (resulting in a determined battery life). The reporting scenario is as follows: (1) the location report is to be transmitted to a host server every hour for the entire life of the battery, (2) the location report includes GPS location data, and (2) this date is transferred over a GSM network (wireless). For simplicity, power consumption in the IDLE state is assumed to be 0 mA, and it is assumed that no timeout conditions occur.

The device parameters are:
  Battery Power Capacity—1000 ma-hours
  GPS Acquisition Power (GPS FIX)—50 mA per second
  GPS Location Power (WAIT FOR OUTSIDE GEOFENCE)—25 mA per second
  GSM Registration (MODEM CONNECT) Power—150 mA per second
  GSM Data Transfer (DATA TRANSFER) Power—100 mA per second The theoretical values of the environmental parameters are:
  Average GPS Acquisition Time—80 seconds
  Average GPS Location Time—10 seconds
  Average GSM Registration Time—90 seconds
  Average GSM Data Transfer Time—10 seconds After the device has been deployed, the actual environmental parameters are:
  Average GPS Acquisition Time—160 seconds
  Average GPS Location Time—20 seconds
  Average GSM Registration Time—180 seconds
  Average GSM Data Transfer Time—20 seconds These actual environmental parameters are calculated by dividing the total measured time in specific states by the number of occurrences of that state (the underlying data is generated by the GPS tracking device 102 and stored therein).

In all calculations, a constant voltage is assumed, so all power calculations will be based upon current only.

Based upon the theoretical environmental parameters, the amount of current required per report is:

$$(50\ mA*80\ sec)+(25\ mA*10\ sec)+(150\ mA\times90\ sec)+(100\ mA\times10\ sec)=18{,}750\ mA\text{-}sec\ per\ report.$$

With a 1000 A-hour battery, the device will theoretically operate for:

$$(1000\ mA\text{-}hour\times3600\ sec/hour)/18{,}750\ mA\text{-}sec\ per\ report=192\ reports.$$

With one report per hour, this corresponds to 192 hours, or eight (8) days.

After the device has been fielded one (1) day, or 24 reports, the actual parameters are measured. The observed battery life is:

$$(50\ mA*160\ sec)+(25\ mA*20\ sec)+(150\ mA\times180\ sec)+(100\ mA\times20\ sec)=37{,}500\ mA\text{-}sec\ per\ report.$$

With a 1000 A-hour battery, the device with actually operate for:

$$(1000\ mA\text{-}hour\times3600\ sec/hour)/37{,}500\ mA\text{-}sec\ per\ report=96\ reports.$$

With one report per hour, this corresponds to 96 hours, or four (4) days. Since one (1) day has already expired, 25% of the battery power has been consumed (250 mA-h), and 75% of the battery power is remaining (750 mA-h). The user wishes to make the battery operate for another six (6) days, but at current settings the device will only operate for another three (3) days. In order to achieve this, the user utilizes the host server 108 to modify the reporting interval to the point that the projected battery life is six (6) more days, or seven (7) days total. By manipulating device operating parameters within the program within the host server 108, a setting of two (2) hours is attempted. With this setting, the projected battery life is:

(750 mA-h×3600 sec/hour)/(37,500 mA-sec per report)=720 reports.

Since this meets the operational objective(s), the device 102 is reprogrammed (as described herein) to the new reporting interval of two (2) hours.

As will be appreciated, the above example is relatively simple, and in most applications, the desired battery life will be on the order of several months to several years.

In some embodiments, some or all of the functions or processes of the one or more of the elements and devices described herein are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for determining power consumption and battery life in a battery-operated device having a battery for supplying power to the device, the method comprising:
receiving historical power consumption data collected during operation of the battery-operated device in accordance with a first set of operating parameters, the first set of operating parameters enabling the battery-operated device to operate in a first operating mode;
calculating, in a computer-based processing system, an observed battery life for the device based on the received historical power consumption data and a power capacity value representing a power capacity of the battery within the device;
outputting the observed battery life;
obtaining the first set of operating parameters for use by the computer-based processing system;
modifying one or more parameters within the first set of operating parameters to generate a second set of operating parameters that when loaded within memory of the battery-operated device will enable the battery-operated device to operate in accordance with a second operating mode;
processing the second set of operating parameters and the power capacity value in the computer-based processing system and calculating a projected battery life for the battery when the device operates in accordance with the second operating mode; and
outputting the projected battery life.

2. The method in accordance with claim 1 wherein outputting the observed battery life further comprises:
displaying the observed battery life.

3. The method in accordance with claim 1 further comprising:
configuring the battery-operated device with the second set of parameters.

4. The method in accordance with claim 1 further comprising:
sending the second set of parameters to the battery-operated device, the second set of parameters enabling subsequent operation of the battery-operated device in the second operating mode instead of the first operating mode and control power consumption in the device.

5. The method in accordance with claim 1 wherein obtaining the second set of parameters further comprises a one of retrieving the first set of parameters from memory associated with the computer-based processing system and receiving the first set of parameters from the battery-operated device.

6. The method in accordance with claim 1 further comprising:
receiving a device identifier from the battery-operated device; and
wherein obtaining the second set of parameters includes retrieving the first set of parameters corresponding to the device identifier from memory associated with the computer-based processing system.

7. The method in accordance with claim 6 further comprising:
storing the second set of operating parameters in memory associated with the computer-based processing system and associating the stored second set of operating parameters the device identifier; and
sending the second set of parameters to the battery-operated device.

8. The method in accordance with claim 1 wherein modifying one or more parameters further comprises:
receiving the one more modified parameters through a graphical user interface (GUI).

9. The method in accordance with claim 8 wherein the GUI includes a plurality of displayable windows, with each window operable for displaying at least one parameter within a current set of parameters that the computer-based processing system has processed.

10. A method for modifying operation of a battery-operated device having a battery and controlling power consumption of the device, the method comprising:
receiving historical data via a communications link from a battery-operated device operating at a remote location in accordance with a current set of operating parameters, the historical data related to a predetermined operating time period, the historical data including a number of occurrences of a first event, a total amount of time spent performing the first events, a number of occurrences of a second event, and a total amount of time spent performing the second events;

calculating an observed power consumption value based on the received historical data;

calculating an observed battery life identifying an observed amount of time the battery will be able to supply power sufficient to operate the device if the device operates in accordance with the current set of operating parameters;

if the observed amount of time is unacceptable, modifying one or more parameters of the current set of parameters to generate a second set of parameters; and sending data to the battery-operated device enabling subsequent operation of the battery-operated device in accordance with the second set of parameters.

11. A host server for calculating power consumption in a battery-operated device and controlling power consumption, the server comprising:

a communications interface operable for receiving historical power consumption data from the battery-operated device, the historical data collected during operation of the battery-operated device in accordance with a first set of operating parameters;

a processor configured to:
calculate an observed battery life for the device based on the received historical power consumption data and a power capacity value representing a power capacity of the battery within the device;

an output device for outputting the observed battery life and one or more parameters of the first set of operating parameters;

an input device for receiving user input to modify one or more parameters within the first set of operating parameters; and wherein the processor is further configured to:
send, via the communications interface, the one or more modified operating parameters to the battery-operated device, the one or more modified operating parameters enabling subsequent operation in accordance therewith.

12. The server in accordance with claim 11 wherein the output device includes a display, and the processor is further configured to:

generate a graphical user interface (GUI) for displaying one of the operating parameters and for enabling user input to modify one of the operating parameters.

13. The server in accordance with claim 11 wherein the processor is further configured to:

calculate a projected battery life for the device based on the received user input, and sending the one or more modified operating parameters to the battery-operated device after calculating the projected battery life.

14. The method in accordance with claim 10 further comprising:

receiving a device identifier from the battery-operated device; and wherein generating the second set of parameters includes retrieving the current set of parameters corresponding to the device identifier from memory.

15. The method in accordance with claim 10 further comprising:

storing the second set of operating parameters in memory and associating the stored second set of operating parameters the device identifier.

16. The method in accordance with claim 10 wherein modifying one or more parameters further comprises:

receiving the one more modified parameters through a graphical user interface (GUI).

17. The method in accordance with claim 16 wherein the GUI includes a plurality of displayable windows, with each window operable for displaying at least one parameter within a current set of parameters that the computer-based processing system has processed.

18. A method for modifying operation of a battery-operated device, the method comprising:

receiving historical data via a communications link relating to a current set of operating parameters, calculating an observed power consumption value based on the received historical data;

calculating an observed battery life identifying an observed amount of time the battery will be able to supply power sufficient to operate the device if the device operates in accordance with the current set of operating parameters;

if the observed amount of time is unacceptable, modifying one or more parameters of the current set of parameters to generate a second set of parameters; and sending data to the battery-operated device enabling subsequent operation of the battery-operated device in accordance with the second set of parameters.

19. The method in accordance with claim 18 wherein the historical data is related to a predetermined operating time period.

* * * * *